US010636625B2

(12) United States Patent
Dhindsa et al.

(10) Patent No.: US 10,636,625 B2
(45) Date of Patent: *Apr. 28, 2020

(54) SYSTEM FOR COORDINATING PRESSURE PULSES AND RF MODULATION IN A SMALL VOLUME CONFINED PROCESS REACTOR

(71) Applicant: Lam Research Corporation, Fremont, CA (US)

(72) Inventors: Rajinder Dhindsa, Pleasanton, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 689 days.

This patent is subject to a terminal disclaimer.

(21) Appl. No.: 14/887,106

(22) Filed: Oct. 19, 2015

(65) Prior Publication Data

US 2016/0042921 A1 Feb. 11, 2016

Related U.S. Application Data

(62) Division of application No. 14/016,994, filed on Sep. 3, 2013, now Pat. No. 9,184,029.

(51) Int. Cl.
*H01J 37/32* (2006.01)

(52) U.S. Cl.
CPC .. *H01J 37/32137* (2013.01); *H01J 37/32082* (2013.01); *H01J 37/32449* (2013.01);
(Continued)

(58) Field of Classification Search
CPC ................................................. H01J 37/32633
See application file for complete search history.

(56) References Cited

U.S. PATENT DOCUMENTS 4,466,380 A * 8/1984 Jansen ................... C23C 16/503
118/692
5,758,680 A * 6/1998 Kaveh ................ G05D 16/2013
118/692
(Continued)

FOREIGN PATENT DOCUMENTS

JP          64-73619       3/1989     ........... H01L 21/203
JP          64-76319       3/1989     ........... H01L 21/203
(Continued)

OTHER PUBLICATIONS

JP 2014-171041, Notification of Reasons for Refusal, English language, dated Jun. 21, 2018 drafting, Meisei Int'l Patent Firm.
(Continued)

*Primary Examiner* — Aiden Lee
(74) *Attorney, Agent, or Firm* — Penilla IP, APC

(57) ABSTRACT

A plasma processing system for processing semiconductor substrates is provided. The plasma processing system includes a plasma processing volume having a volume less than the processing chamber. The plasma processing volume is defined by a top electrode, a substrate support surface opposing the surface of the top electrode and a plasma confinement structure including at least one outlet port. A conductance control structure is movably disposed proximate to the at least one outlet port and capable of controlling an outlet flow through the at least one outlet port between a first flow rate and a second flow rate. The conductance control structure controls the outlet flow rate and an at least one RF source is modulated and at least one process gas flow rate is modulated corresponding to a selected processing state set by the controller during a plasma process.

14 Claims, 34 Drawing Sheets

(52) U.S. Cl.
CPC .. *H01J 37/32532* (2013.01); *H01J 37/32623* (2013.01); *H01J 37/32633* (2013.01); *H01J 37/32816* (2013.01); *H01J 37/32834* (2013.01)

(56) References Cited

U.S. PATENT DOCUMENTS

| | | | | |
|---|---|---|---|---|
| 5,871,813 | A * | 2/1999 | Pham | B01J 3/002 118/715 |
| 5,997,589 | A | 12/1999 | Tien | |
| 6,123,097 | A * | 9/2000 | Truong | F16K 49/002 118/719 |
| 6,261,408 | B1 * | 7/2001 | Schneider | C23C 16/4412 118/715 |
| 6,535,785 | B2 | 3/2003 | Johnson et al. | |
| 7,294,580 | B2 | 11/2007 | Yun et al. | 438/710 |
| 7,381,644 | B1 * | 6/2008 | Subramonium | C23C 16/26 438/671 |
| 8,627,783 | B2 | 1/2014 | Fischer et al. | 118/723 R |
| 2002/0026251 | A1 | 2/2002 | Johnson et al. | |
| 2002/0076490 | A1 * | 6/2002 | Chiang | C23C 16/0227 427/248.1 |
| 2002/0117472 | A1 * | 8/2002 | Sun | H01J 37/321 216/68 |
| 2002/0170881 | A1 * | 11/2002 | Benzing | H01J 37/3244 216/67 |
| 2004/0159286 | A1 * | 8/2004 | Aoki | H01J 37/32623 118/723 E |
| 2004/0224520 | A1 * | 11/2004 | Yun | H01L 21/31116 438/691 |
| 2006/0000799 | A1 | 1/2006 | Doh et al. | |
| 2010/0154709 | A1 * | 6/2010 | Fischer | H01J 37/32449 118/723 I |

FOREIGN PATENT DOCUMENTS

| | | | |
|---|---|---|---|
| JP | 2000-311883 | 11/2000 | ......... H01L 21/3065 |
| JP | 2003-31559 | 1/2003 | ......... H01L 21/3065 |
| TW | 201117284 A | 5/2011 | |
| WO | WO 2005/122226 A1 | 12/2005 | ......... H01L 21/311 |
| WO | WO 2010/080423 A2 | 7/2010 | ......... H01L 21/3065 |
| WO | WO 2013/072834 A1 | 5/2013 | ........... C23C 16/455 |

OTHER PUBLICATIONS

JP 2014-171041, Notification of Reasons for Refusal, Japanese language, dated Jun. 21, 2018 drafting, Meisei Int'l Patent Firm.
JP 2014-171041, Notification of Reasons for Refusal, English language, dated Nov. 13, 2018 drafting, Meisel Int'l Patent Firm.
JP 2014-171041, Notification of Reasons for Refusal, Japanese language, dated Nov. 13, 2018 drafting, Meisei Int'l Patent Firm.

* cited by examiner

SYSTEM FOR COORDINATING PRESSURE PULSES AND RF MODULATION IN A SMALL VOLUME CONFINED PROCESS REACTOR

CLAIM OF PRIORITY

This application claims priority as a divisional from U.S. patent application Ser. No. 14/016,994, filed on Sep. 3, 2013, entitled, SYSTEM, METHOD AND APPARATUS FOR COORDINATING PRESSURE PULSES AND RF MODULATION IN A SMALL VOLUME CONFIDED PROCESS REACTOR, which is herein incorporated by reference.

FIELD OF THE DISCLOSURE

The present invention relates generally to plasma etch processes, and more particularly, to methods and systems for controlling plasma etch processes

BACKGROUND

Semiconductor device dimensions are pressed to ever smaller dimensions to enable more devices per wafer with higher performance. As semiconductor device dimensions become smaller, new challenges are presented in the process technology needed to form the smaller, more densely packed devices with high yield. These process requirements demand a precise control of plasma chemistry (radical, neutral and ions) to meet both on die as well as across semiconductor wafer etch requirements.

FIG. 1 is a side view of a simplified schematic drawing of a typical narrow gap plasma processing chamber 100. Process gases are injected through a substantially central location 104 of the top portion 108 of the plasma processing chamber 100. The process gases are injected into the plasma processing volume 110 defined as being over the semiconductor wafer 101 to be processed. The semiconductor wafer 101 is supported on a wafer support 106.

The process gases flow in a substantially radial direction 112 through the plasma processing volume 110 toward a plasma confinement structure 114 at the periphery of the plasma processing volume. The process gases and plasma process byproducts are pumped out at the periphery through peripheral vents 116 to one or more vacuum pumps 118.

Typical plasma processes are performed at fixed process gas pressure and flow. The fixed process gas pressure and flow often causes radial pressure distributions. By way of example, the pressure P1, P2, P3 in each respective portion 120, 122, 124, 126 of the plasma processing volume 110 can vary due to convective flow and other causes.

What is needed is a system, method and apparatus for dynamically changing and controlling the peripheral conductance of the process gases so as to induce a fast change in the pressure in the plasma processing volume 110.

SUMMARY

Broadly speaking, the present invention fills these needs by providing a system, method and apparatus for dynamically changing and controlling the peripheral conductance of the process gases so as to induce a fast change in the pressure in the plasma processing volume. It should be appreciated that the present invention can be implemented in numerous ways, including as a process, an apparatus, a system, computer readable media, or a device. Several inventive embodiments of the present invention are described below.

One embodiment provides a plasma processing system and method that includes a processing chamber, and a plasma processing volume included therein. The plasma processing volume having a volume less than the processing chamber. The plasma processing volume being defined by a top electrode, a substrate support surface opposing the surface of the top electrode and a plasma confinement structure including at least one outlet port. A conductance control structure is movably disposed proximate to the at least one outlet port and capable of controlling an outlet flow through the at least one outlet port between a first flow rate and a second flow rate, wherein the conductance control structure controls the outlet flow rate and an at least one RF source is modulated and at least one process gas flow rate is modulated corresponding to a selected processing state set by the controller during a plasma process.

Another embodiment provides a method of modulating a pressure in-situ in a plasma processing volume of a chamber, the plasma processing volume defined between a surface of a top electrode, a supporting surface of a substrate support and an outer region defined by a plasma confinement structure. The plasma confinement structure including at least one outlet port. The method including injecting at least one processing gas into the plasma processing volume, forming a plasma within the plasma processing volume and modulating a pressure and an RF signal applied to the plasma processing volume during a period of time when the plasma is formed in the plasma processing volume. The modulating of the pressure being controlled by at least one of a first outlet flow out of the plasma processing volume from the at least one outlet port, the first outlet flow being a restricted flow path out of the at least one outlet port, or a second outlet flow out of the plasma processing volume from the at least one outlet port, the second outlet flow being greater than the first outlet flow, wherein the second outlet flow being through a less restricted flow path out of the at least one outlet port than the first outlet flow.

Yet another embodiment provides a chamber, including a substrate support, a top electrode, a confinement structure disposed to surround the substrate support, such that a plasma processing volume is defined between the substrate support, the top electrode and the confinement structure. At least one RF source coupled to at least one of the top electrode and the substrate support. The confinement structure includes multiple outlet ports that surround the substrate support. A conductance control structure is disposed outside of the plasma processing volume and proximate to the outlet ports, the conductance control structure having a positioning actuator that provides movement of the conductance control structure between a first position and a second position, the first position placing the conductance control structure immediately adjacent to the plurality of outlet ports and the second position placing the conductance control structure in a location spaced away from the plurality of outlet ports. The at least one RF source can be modulated to correspond to the first position and the second position of the conductance control structure. The gas flow into the plasma processing volume can also be modulated to correspond to the first position and the second position of the conductance control structure.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Figure 1:
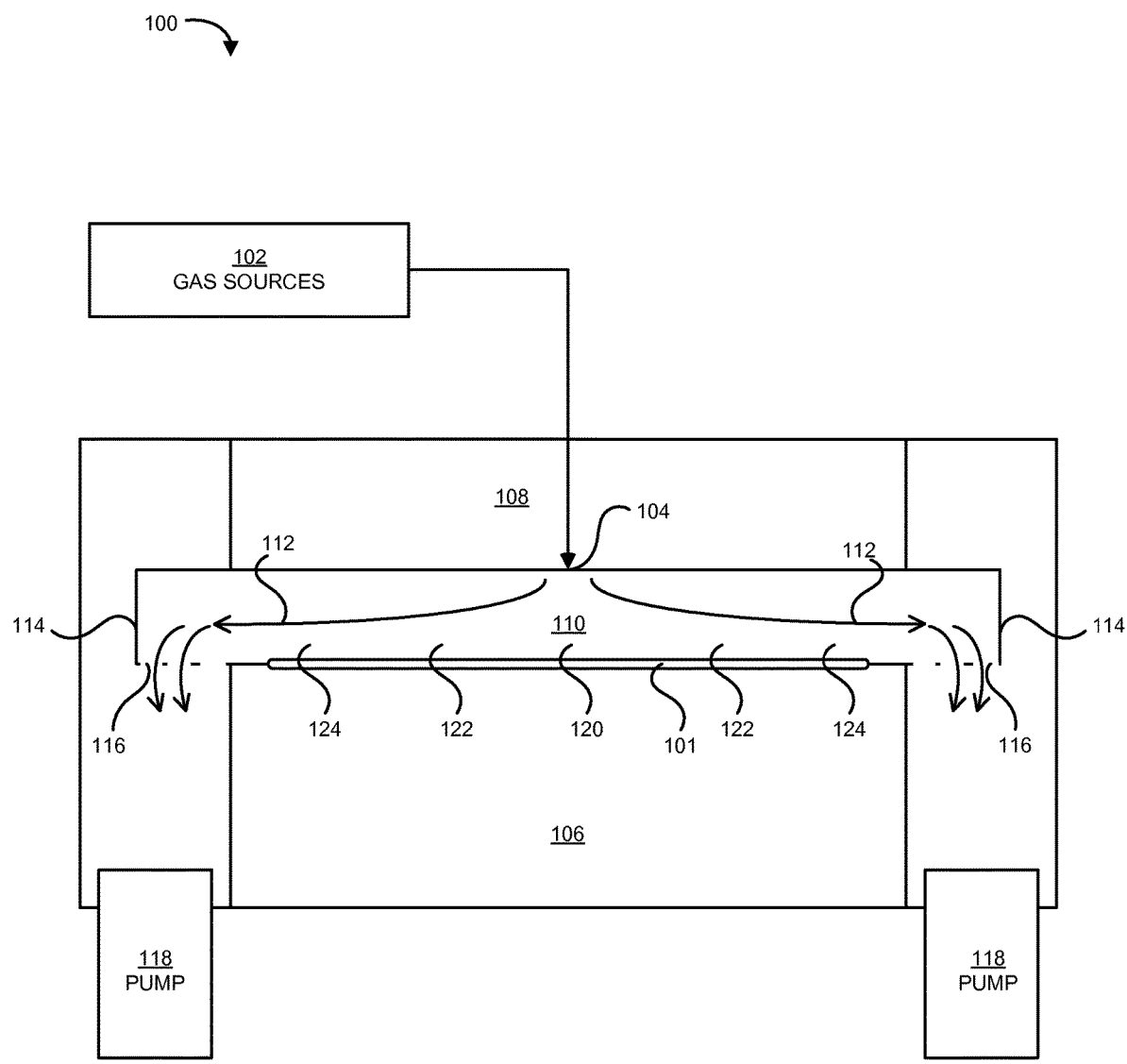
FIG. 1 is a side view of a simplified schematic drawing of a typical narrow gap plasma processing chamber.

Several exemplary embodiments for a system, method and apparatus for dynamically changing and controlling the peripheral conductance of the process gases so as to induce a fast change in the pressure in the plasma processing volume will now be described. It will be apparent to those skilled in the art that the present invention may be practiced without some or all of the specific details set forth herein.

One proposed system and method provides a small plasma processing volume defined as the volume between the surface being processed, a top surface of a plasma confinement structure and an outer perimeter of the plasma confinement structure. One or more point of use gas conductance control mechanisms near the outer perimeter of the plasma confinement structure enable localized, faster pressure changes within the plasma processing volume than can be achieved by changing a pressure of the entire process chamber.

Introducing a gas conductance change at the peripheral conductance of the process gases and by-products can be achieved by producing a fast change in the pressure in the plasma processing volume above the surface being processed (e.g., a wafer surface). One approach controls the rate of gases (e.g., process gases and plasma byproducts) flow out of the plasma processing volume with a conductance control ring. An output flow through at least a portion of outlet ports in a plasma confinement structure can be more restricted or less restricted varying between substantially completely restricted flow to substantially fully unrestricted flow by a conductance control ring to vary the pressure within the plasma processing volume above the wafer. The more or less restriction of the outlet ports in the plasma confinement structure can be performed by a shifting, moving or rotating at least a portion of the conductance control ring located near or around a set of outlet ports in a perimeter of the plasma confinement structure.

A conductance profile can be selected with a shifting, moving or rotating speed profile of the conductance control ring. A controlled motion of the conductance control ring can be linear or rotational with respect to the outlet ports in the perimeter of the plasma confinement structure. A time profile of the control motion of the conductance control ring can provide a corresponding pressure modulation within the plasma processing volume relative to time.

Variations in pressure in the plasma processing volume can vary or modulate several parameters including, ions to neutral ratio, ion energy, IEDF and IADF. At low pressure there is less collision between the ions entering the plasma sheath (voltage drop) above the wafer surface. Reducing ion collisions causes more of the ions to exit the plasma sheath in a substantially perpendicular direction to the plasma sheath and to the surface of the substrate being processed. As a result, reducing the ion collisions improves the directionality of the ions entering any features present in the surface of the substrate being processed.

Further, as the pressure changes the effective plasma density as well an area ratio changes. Changing the effective plasma density and/or the area ratio also changes the ion energy distribution function (IEDF) from a low ion energy ratio to a high ion energy ratio. The ion energy distribution function can be adjusted to affect the plasma processing performance of the process within the plasma processing volume.

By way of example, a precise control of ion to neutral flux is one important operational parameter used to maintain a good mask profile during etch. A good mask profile during etch directly impacts the quality of the final etch profile.

A fast pressure pulse in the plasma processing volume can also be synchronized with RF power delivery and/or process gas chemistry modulation and/or wafer temperature profile to further enhance the desired control of ion to neutral flux along with difference process chemistry, to meet the requirement of next generation etch processes. A pressure pulse within the plasma processing volume can also provide a plasma chemistry control to the feature being etched and thus provide improved selectivity, profile control and radial uniformity.

Figure 2A:
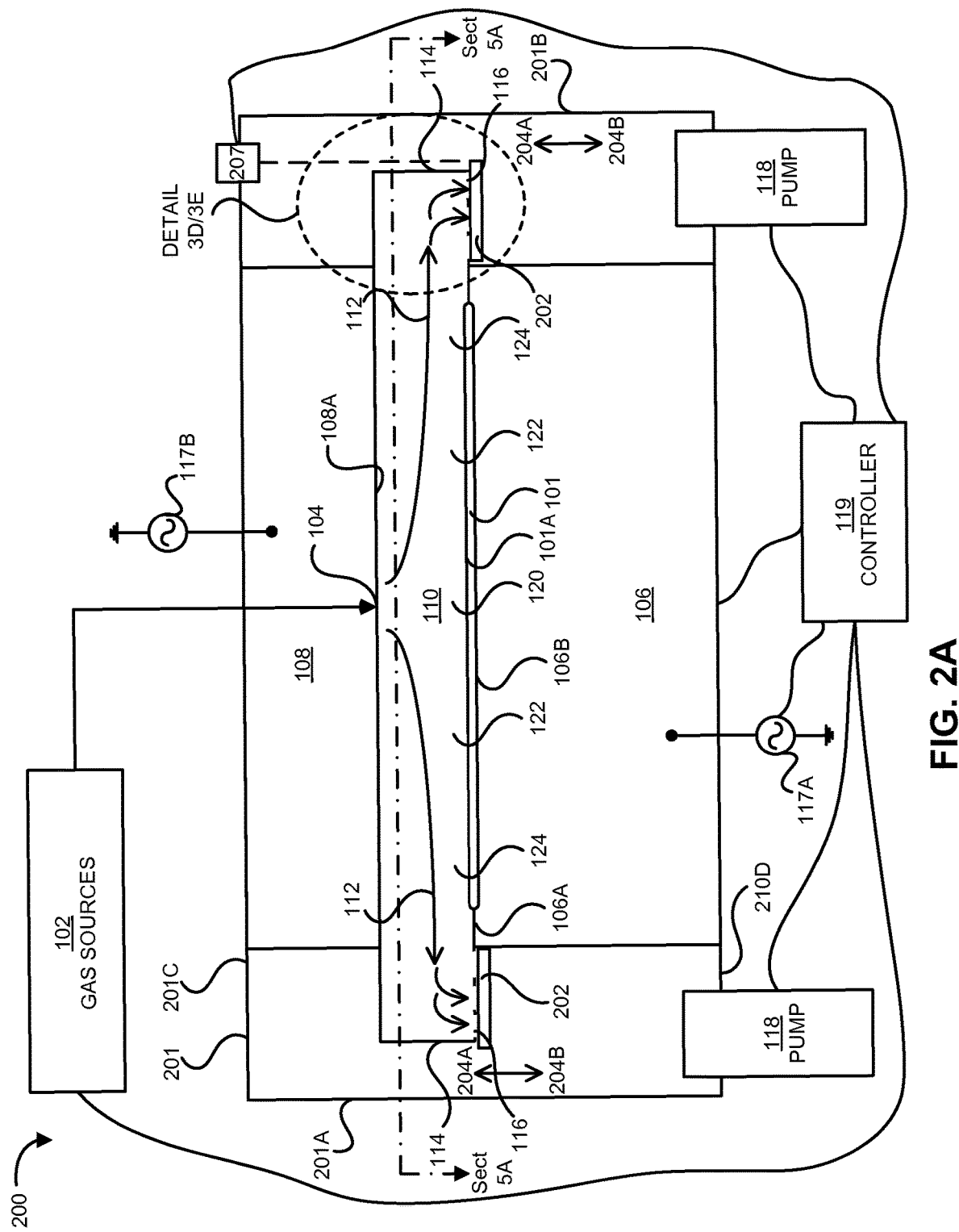
FIGS. 2A and 2B are schematic diagrams of a small volume plasma processing chamber system, in accordance with one embodiment of the present invention.
Figure 2B:
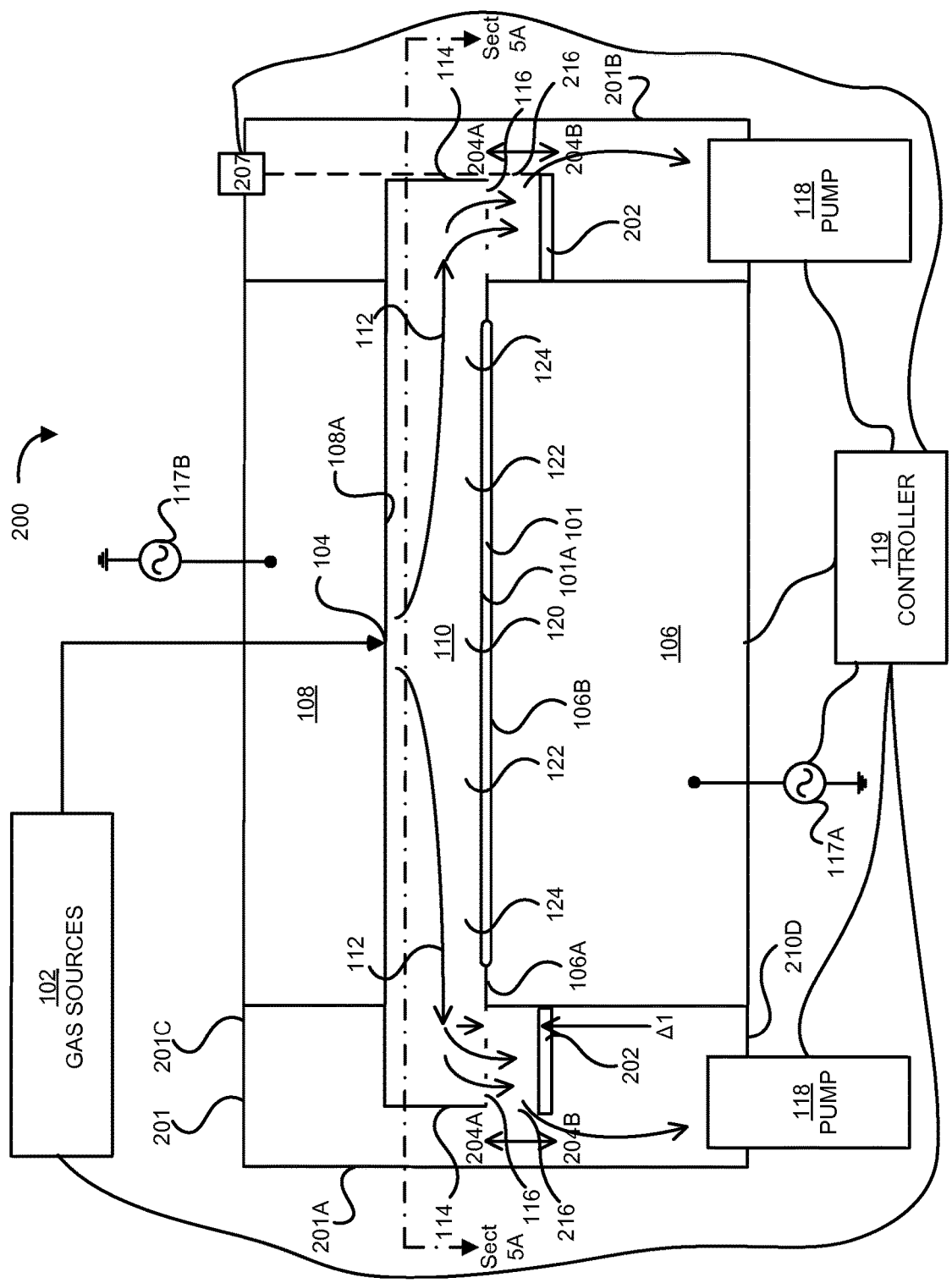

FIGS. 2A and 2B are schematic diagrams of a small volume plasma processing chamber system 200, in accordance with one embodiment of the present invention. The small volume plasma processing chamber system 200 includes a processing chamber 201, one or more gas sources 102, one or more RF sources 117A, 117B and a controller 119 coupled to the processing chamber and the gas sources. The processing chamber 201 is defined by inner walls 201A-D and includes a substrate support 106 for supporting a substrate 101.

The processing chamber 201 also includes a plasma processing volume 110. The plasma processing volume 110 is defined by an inner surface 108A of the top 108 of the plasma processing chamber (e.g., a surface of a top electrode coupled to RF source 117B), the surface 106A, 106B of the substrate support 106 (e.g., a bottom electrode coupled to RF source 117A), if the substrate 101 is not present, and the surface 106A and the surface 101A of the substrate 101, when the substrate is present. The plasma processing volume 110 is typically less than about 10 percent of the total volume of the processing chamber 201. A plasma confinement structure 114 defines an outer perimeter of the plasma processing volume 110.

The plasma confinement structure 114 includes multiple outlet ports 116. A positioning actuator 207 is coupled to the conductance control structure 202 to apply a desired level of restriction to the outlet ports 116. The outlet ports 116 can be substantially fully restricted to minimize gas output flow through the outlet ports, as shown in FIG. 2A, by a conductance control structure 202 being placed immediately adjacent to the outlet ports 116. The restricted outlet ports 116 restrict the flow of the process gases and plasma byproducts out of the plasma processing volume 110 and thus generates an increased pressure within the limited volume of only the plasma processing volume 110.

When the outlet ports 116 are restricted, the pressure within the plasma processing volume 110 can increase at a rate of up to about 20 mtorr per 100 ms. In many plasma processes a relatively small pressure increase in the plasma processing volume 110, as little as about 5 mtorr pressure, can be a sufficient pressure change to create the desired effects. The restricted outlet ports 116 can generate an increased pressure within the plasma processing volume 110 of about 50 mtorr or greater, with more time is allowed.

By way of example, if only 5 mtorr pressure increase is desired, then the outlet ports 116 may only need to be restricted for about 25 ms, which is about 25 percent of the time required to increase the pressure 20 mtorr, within the plasma processing volume 110. Alternatively, if a 40 mtorr pressure increase is desired, then the outlet ports 116 may need to be restricted about 200 ms, which is about 200 percent of the time required to increase the pressure 20 mtorr, within the plasma processing volume 110.

Alternatively, as shown in FIG. 2B, the outlet ports 116 can be substantially fully unrestricted when the positioning actuator 207, moves the conductance control structure 202 a sufficient distance $\Delta 1$ away from the outlet ports 116, where distance $\Delta 1$ is between about 0.25 mm to about 25 mm (i.e., between about 0.01 inches and about 1.0 inches) and more specifically between about 0.25 mm to about 12.5 mm (i.e., between about 0.01 inches and about 0.5 inches).

The substantially fully unrestricted outlet ports 116 can more freely allow the flow of the process gases and plasma byproducts toward the vacuum pumps 118. When substantially fully unrestricted, the outlet ports 116 can generate a pressure decrease within the plasma processing volume 110 of a rate of up to about 20 mtorr per 100 ms. The conductance control structure 202 can be moved any desired more or less than distance $\Delta 1$ away from the outlet ports 116 to provide a corresponding selected amount of restriction to the outlet flow through the outlet ports.

Modulating the amount of restriction of the outlet flow of the outlet ports 116 can be used to correspondingly modulate an increase and a decrease of the pressure within only the plasma processing volume 110 at a rate of about 10 Hz. The pressure in the remainder of the processing chamber 201, external of the plasma processing volume 110, remains substantially constant while the pressure within the plasma processing volume is varied.

It should be understood that the above examples are mere exemplary embodiments and different structures of and control schemes of the conductance control structure 202 and the plasma confinement structure 114 will have correspondingly different pressure rate increases and decreases within the plasma processing volume 110 to correspond with the opening and closing of the ports 116.

FIGS. 3A-3D are schematic diagrams of an alternative small volume plasma processing chamber system 300, in accordance with one embodiment of the present invention. The small volume plasma processing chamber system 300 is substantially similar to the small volume plasma processing chamber system 200 described in FIGS. 2A and 2B, above. The primary difference is the multiple outlet ports 116' are moved to the outer periphery of the plasma confinement structure 114. Correspondingly, the conductance control structure 302 is placed in a location proximate to the outlet ports 116'.

Figure 3A:
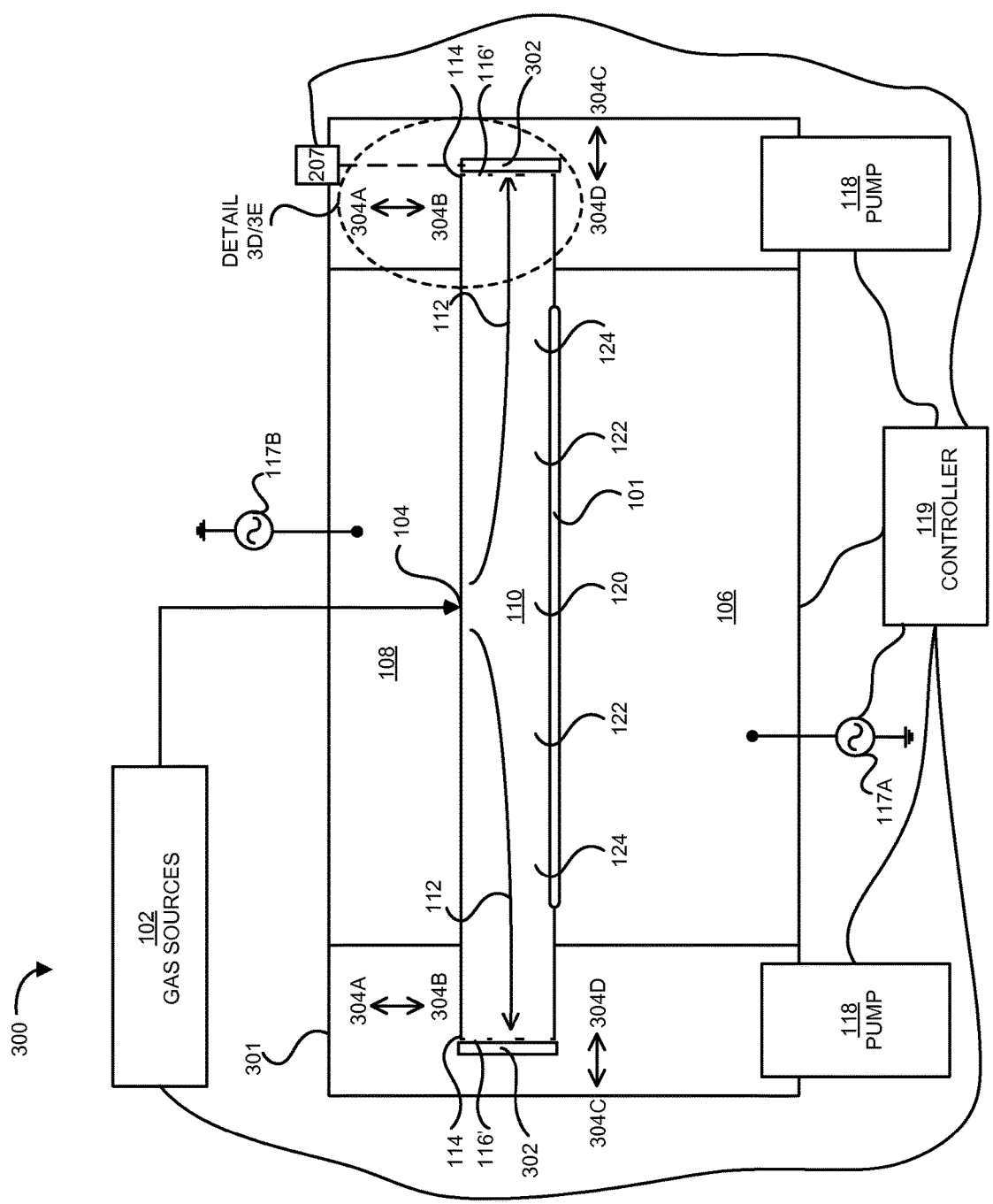
FIGS. 3A-3D are schematic diagrams of an alternative small volume plasma processing chamber system, in accordance with one embodiment of the present invention.
Figure 3B:
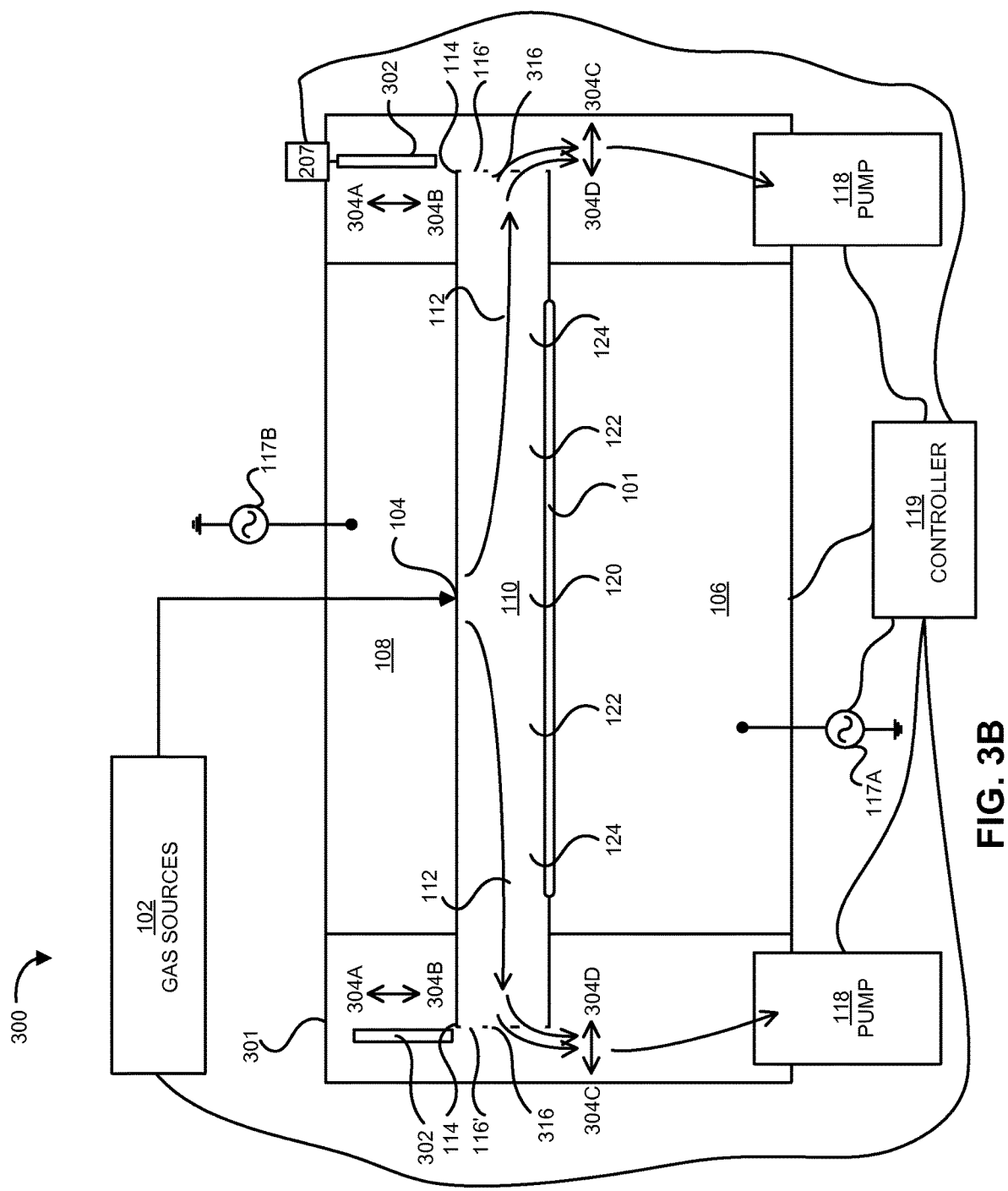

Operationally, the small volume plasma processing chamber system 300 is substantially similar to the small volume plasma processing chamber system 200. By way of example, moving the conductance control structure 302 selects an amount of restriction to the outlet flow through the outlet ports 116' and correspondingly modulates the pressure within the plasma processing volume 110. As shown in FIG. 3A, the conductance control structure 302 substantially fully restricted the outlet flow through the outlet ports 116'. As shown in FIG. 3B, the conductance control structure 302 is shifted vertically in a direction 304A to partially un-restrict and partially restrict the outlet flow through the outlet ports 116'.

Figure 3C:
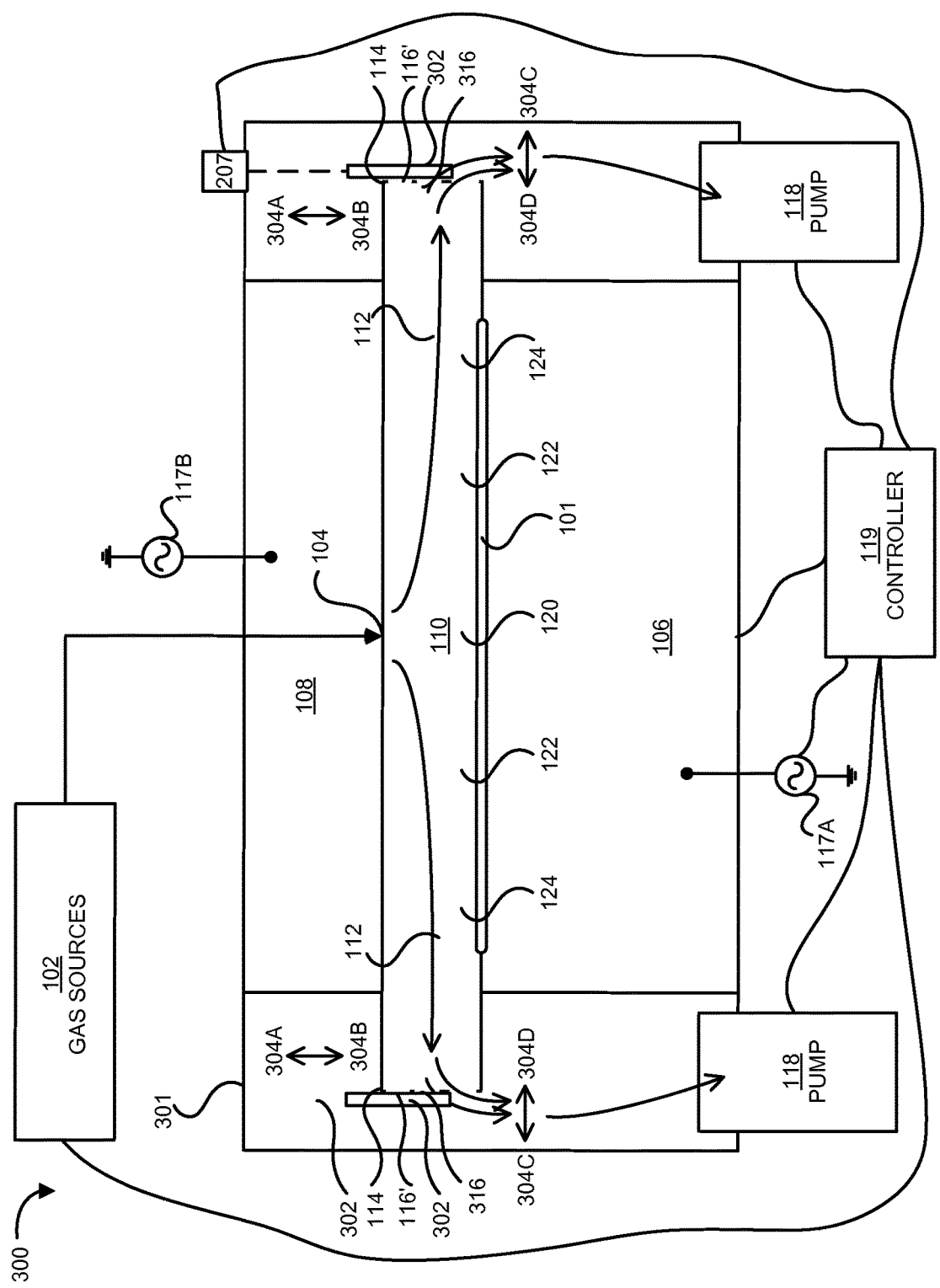
Figure 3D:
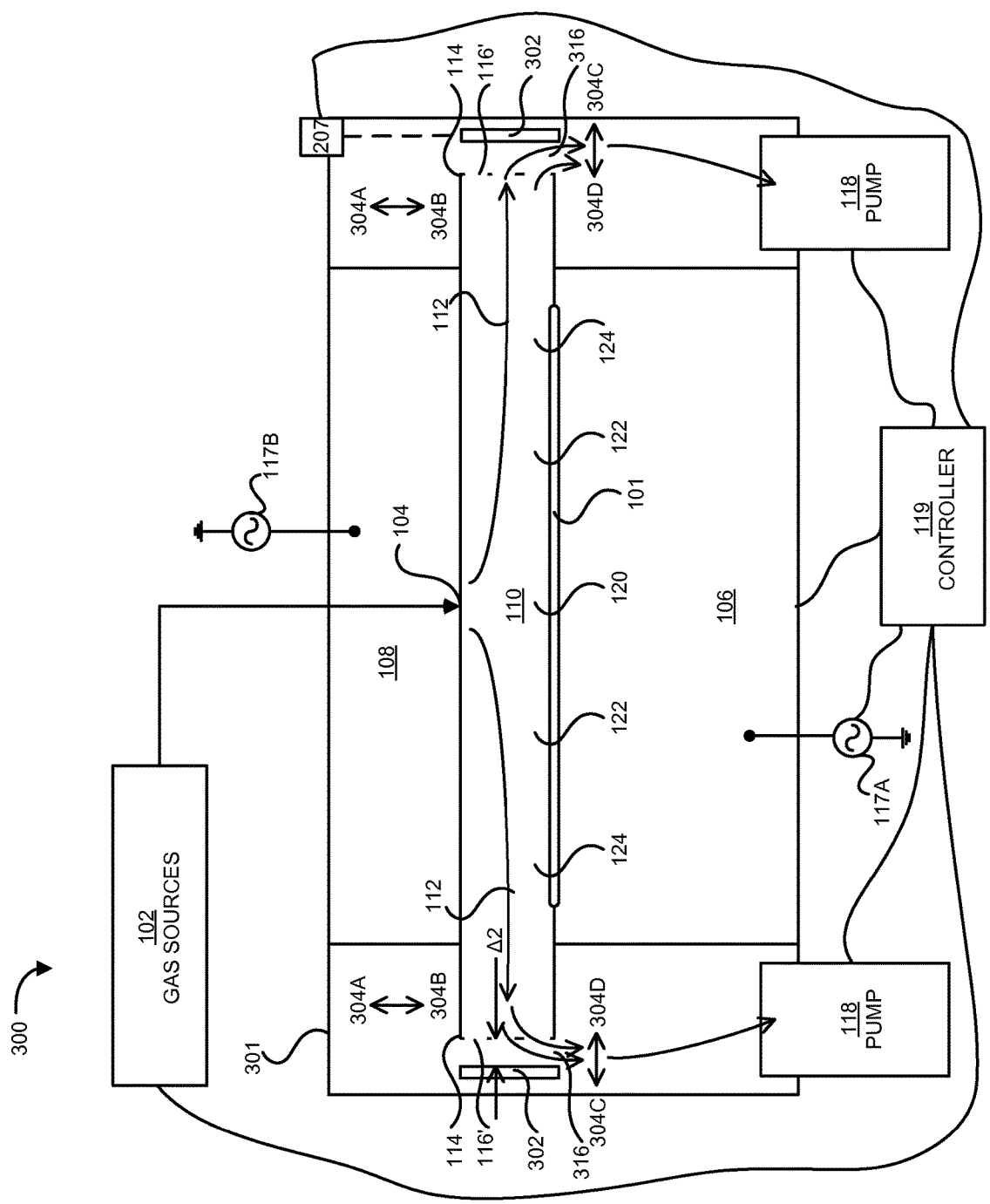

As shown in FIG. 3C, the conductance control structure 302 is shifted vertically in a direction 304A to substantially fully un-restrict the outlet flow through the outlet ports 116'. As shown in FIG. 3D, the conductance control structure 302 is shifted horizontally a distance Δ2 in a direction 304C to create openings 316 so as to reduce the restriction to the outlet flow through the outlet ports 116'.

Figure 3E:
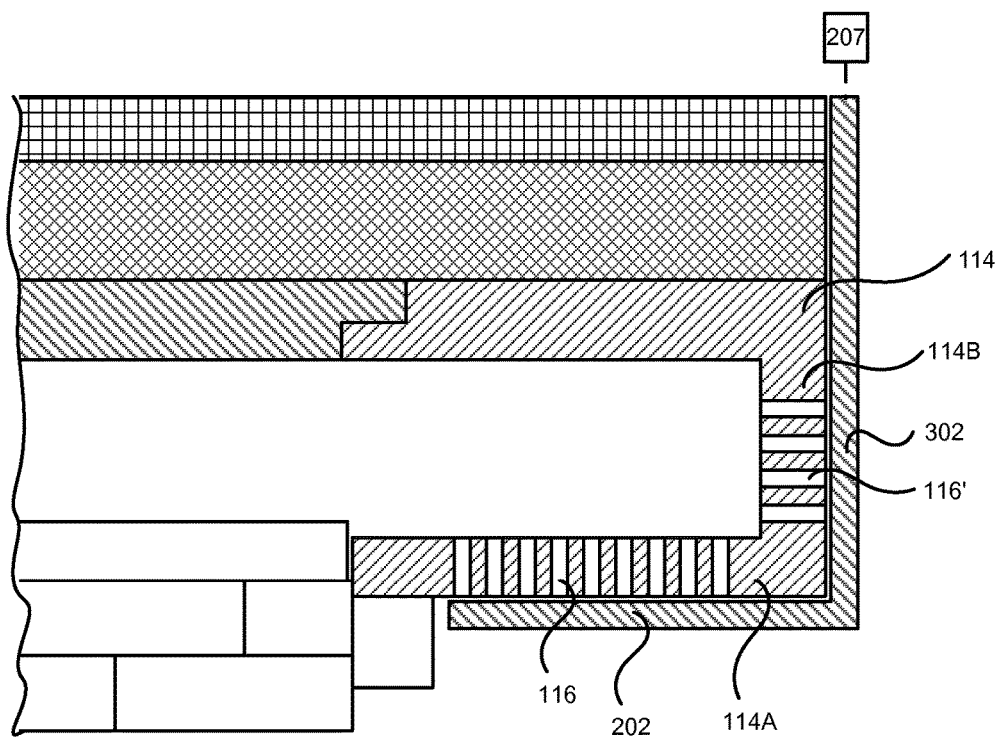
FIG. 3E is a detailed cross-sectional view the conductance control structures and the plasma confinement structure, in accordance with one embodiment of the present invention.

FIG. 3E is a detailed cross-sectional view the conductance control structures 202 and 302 and the plasma confinement structure 114, in accordance with one embodiment of the present invention. The plasma confinement structure 114 includes many outlet ports 116 in the bottom facing portion 114A and many outlet ports 116' in the peripheral portion 114B. The conductance control structures 202 and 302 are coupled to the positioning actuator 207 and can be moved close to the outlet ports 116, 116', as shown, to restrict the outlet flow through the outlet ports or away from the outlet ports to substantially fully un-restrict the outlet flow through the outlet ports as shown in the previously discussed FIGS. 2A-3D.

Figure 3F:
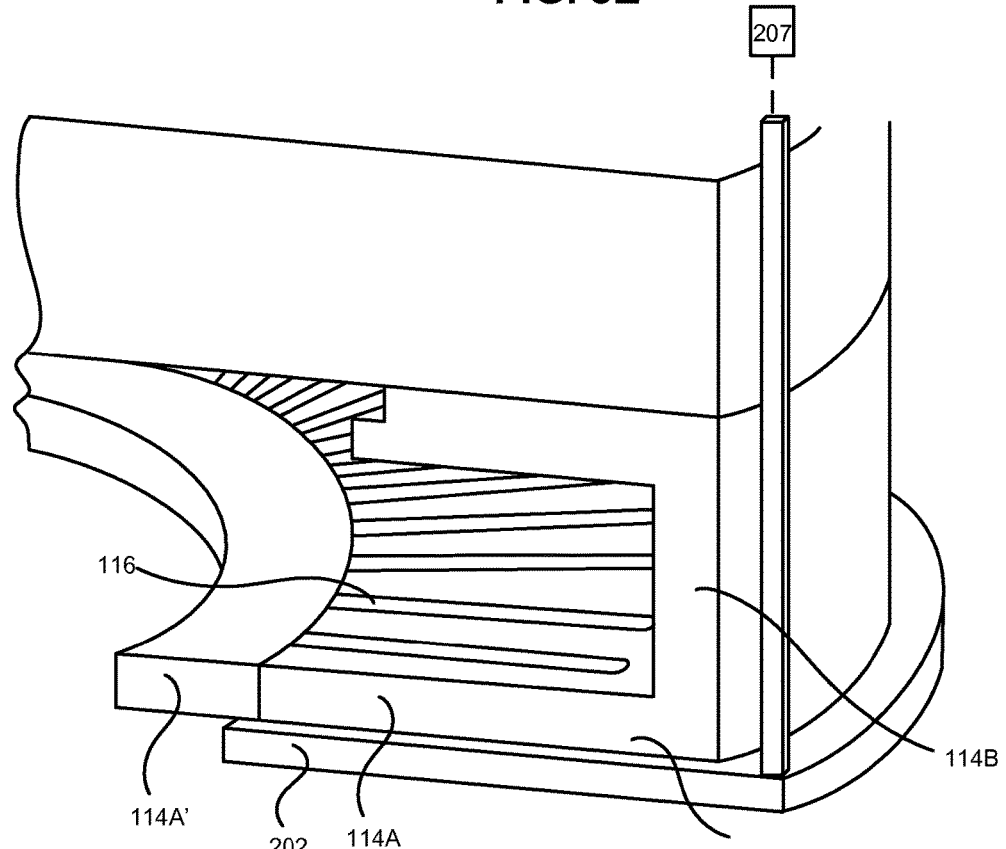
FIG. 3F is a detailed perspective view the conductance control structure 302 and the plasma confinement structure, in accordance with one embodiment of the present invention.

FIG. 3F is a detailed perspective view the conductance control structure 302 and the plasma confinement structure 114, in accordance with one embodiment of the present invention. The plasma confinement structure 114 includes many radial slot shaped outlet ports 116 in the bottom facing portion 114A. The slot shaped outlet ports 116 extend outward from the interior portion 114A' toward the peripheral portion 114B.

Figure 4A:
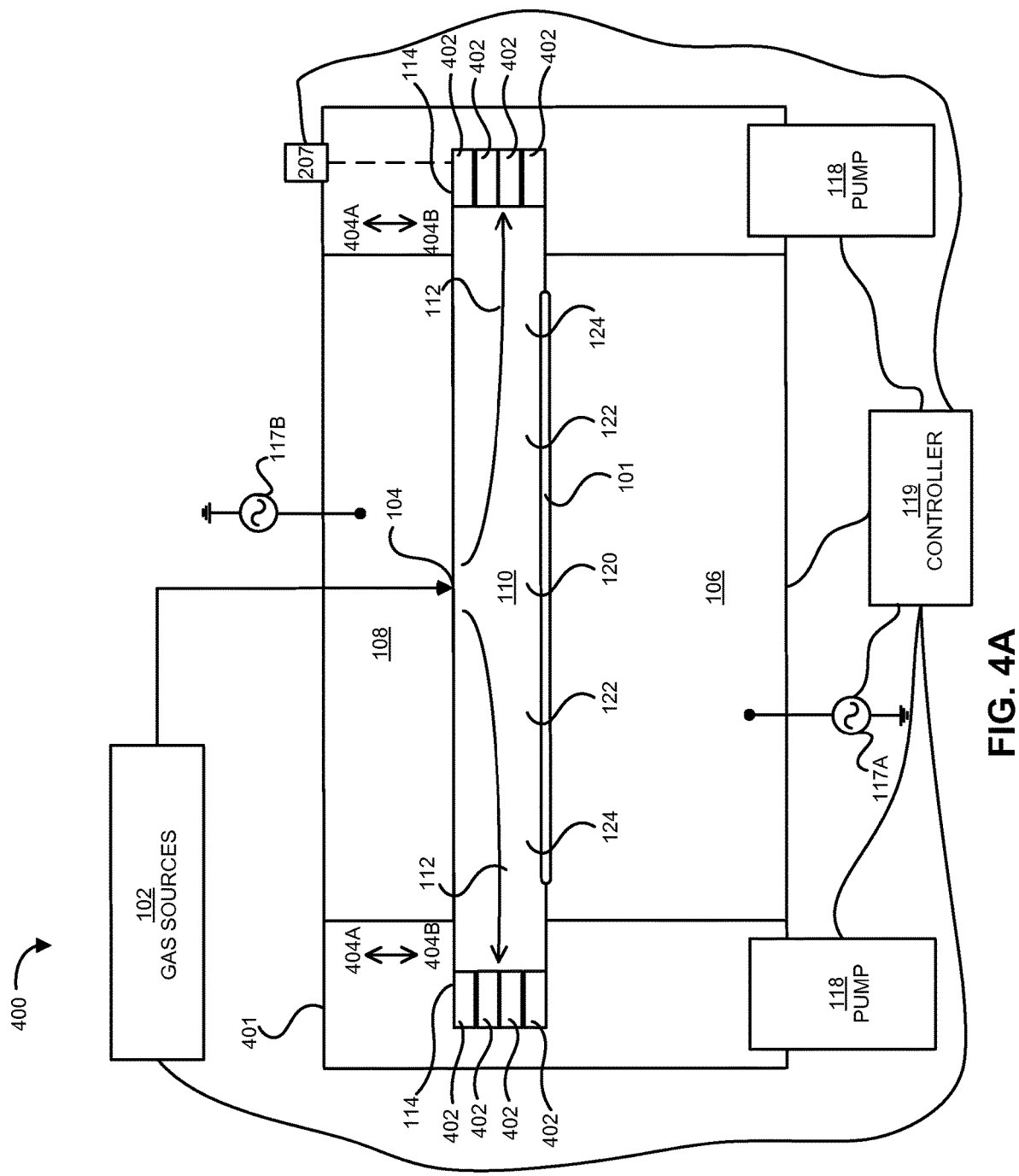
FIGS. 4A and 4B are schematic diagrams of an alternative small volume plasma processing chamber system, in accordance with one embodiment of the present invention.
Figure 4B:
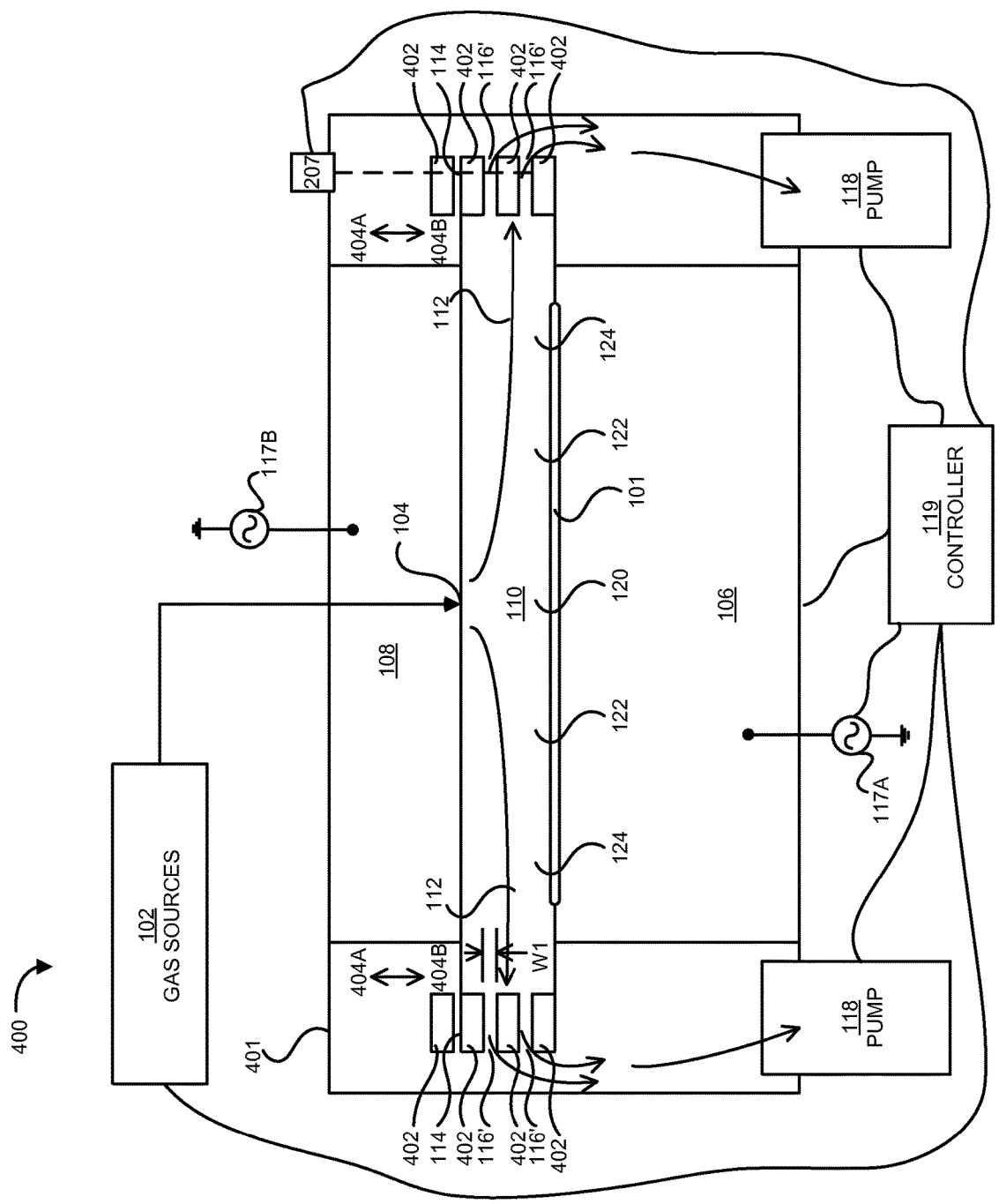

FIGS. 4A and 4B are schematic diagrams of an alternative small volume plasma processing chamber system 400, in accordance with one embodiment of the present invention. The small volume plasma processing chamber system 400 is substantially similar to the small volume plasma processing chamber system 200 described in FIGS. 2A and 2B, above. The primary difference is the multiple outlet ports 116' are formed between corresponding plasma confinement rings 402 in the peripheral portion 114B of the plasma confinement structure 114. The plasma confinement rings 402 are shown collapsed together or closed in FIG. 4A, thus with the outlet ports 116' being substantially fully restricted or closed.

Operationally, the small volume plasma processing chamber system 400 is substantially similar to the small volume plasma processing chamber system 200. By way of example, separating the plasma confinement rings 402 reduces the restriction the outlet flow through the outlet ports 116' as a width W1 of the outlet ports is increased. Separating and collapsing the plasma confinement rings 402 in respective direction 404A, 404B can correspondingly modulate the pressure within the plasma processing volume 110.

Figure 5A:
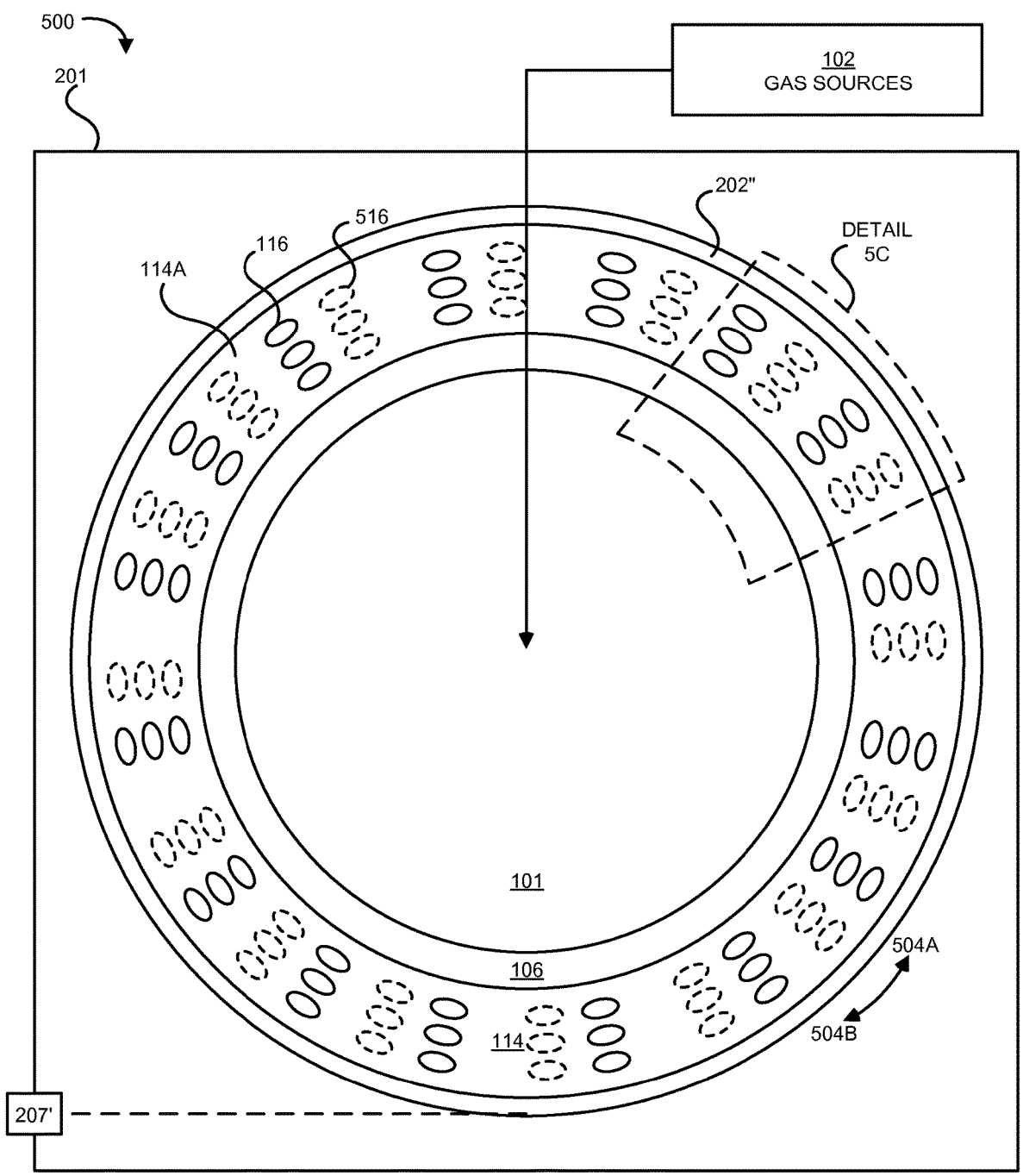
FIGS. 5A and 5B are simplified cross-sectional views of an alternative small volume plasma processing chamber system, in accordance with one embodiment of the present invention.
Figure 5B:
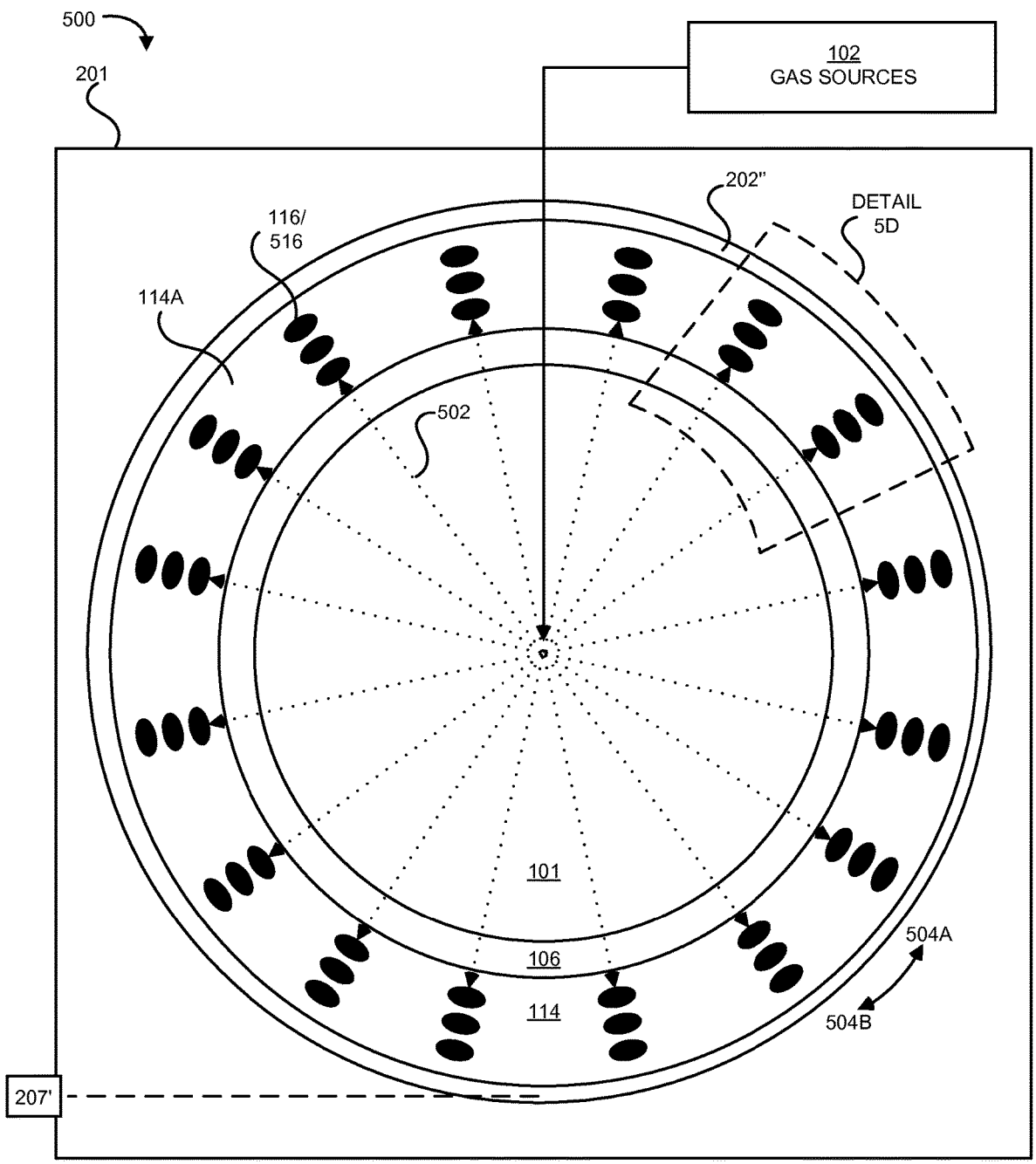
Figure 5C:
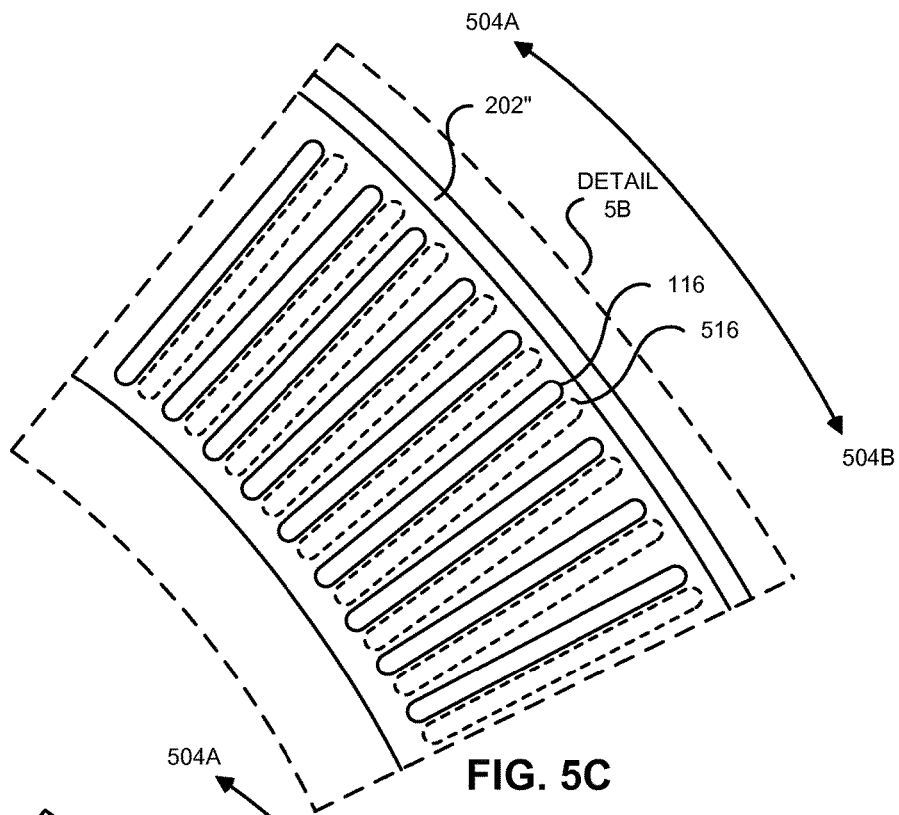
FIGS. 5C and 5D are detailed views of a portion of the bottom facing or substantially horizontal portion of the plasma confinement structure in an alternative small volume plasma processing chamber system, in accordance with one embodiment of the present invention.
Figure 5D:
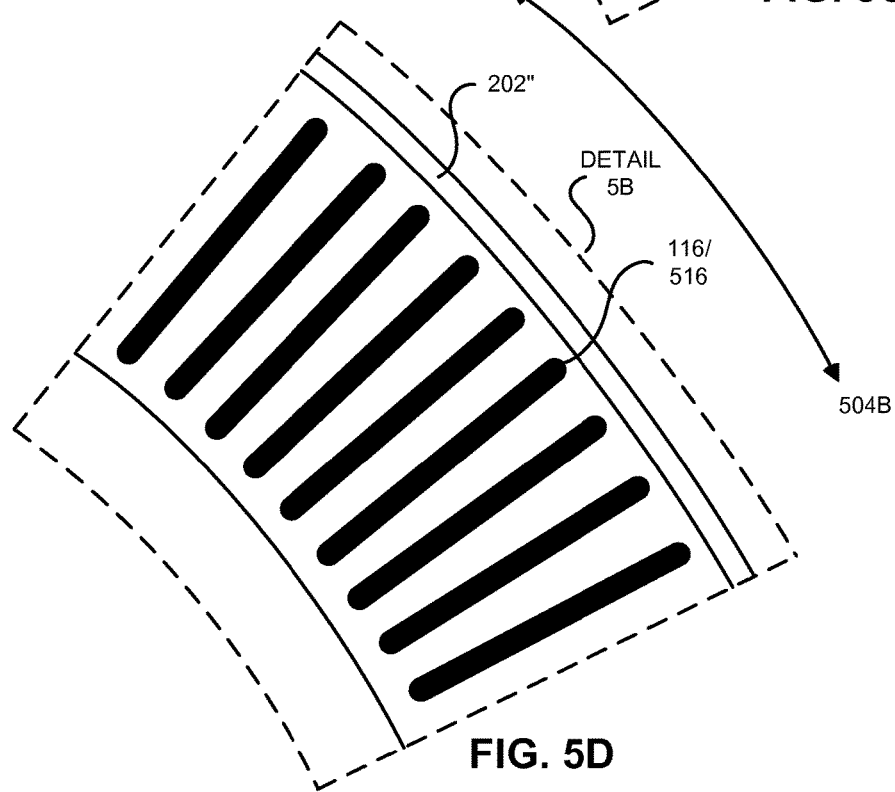

FIGS. 5A and 5B are simplified cross-sectional views of an alternative small volume plasma processing chamber system 500, in accordance with one embodiment of the present invention. FIGS. 5C and 5D are detailed views of a portion of the bottom facing or substantially horizontal portion 114A of the plasma confinement structure 114 in an alternative small volume plasma processing chamber system 500, in accordance with one embodiment of the present invention.

The small volume plasma processing chamber system 500 is substantially similar to the small volume plasma processing chamber system 200 described in FIGS. 2A and 2B, above. The primary difference is restriction of the outlet flow through the multiple outlet ports 116 is increased and decreased by shifting the conductance control structure 202" in a rotational direction 504A or 504B to align or partially align the outlet ports 116 with the corresponding openings 516 in the conductance control structure.

The positioning actuator 207' can move or shift or rotate the conductance control structure 202" in rotational directions 504A and 504B. As shown in FIGS. 5A and 5C, the outlet ports 116 are not aligned the corresponding openings 516 in the conductance control structure and thus the outlet flow through the ports is substantially fully restricted. As shown in FIGS. 5B and 5D, the outlet ports 116 are aligned the corresponding openings 516 in the conductance control structure and thus the outlet ports are open and substantially fully unrestricted. It should be understood that the outlet ports 116 can be partially aligned with the corresponding openings 516 in the conductance control structure and thus the outlet flow through the outlet ports can be adjusted between substantially fully unrestricted and substantially fully restricted.

Figure 5E:
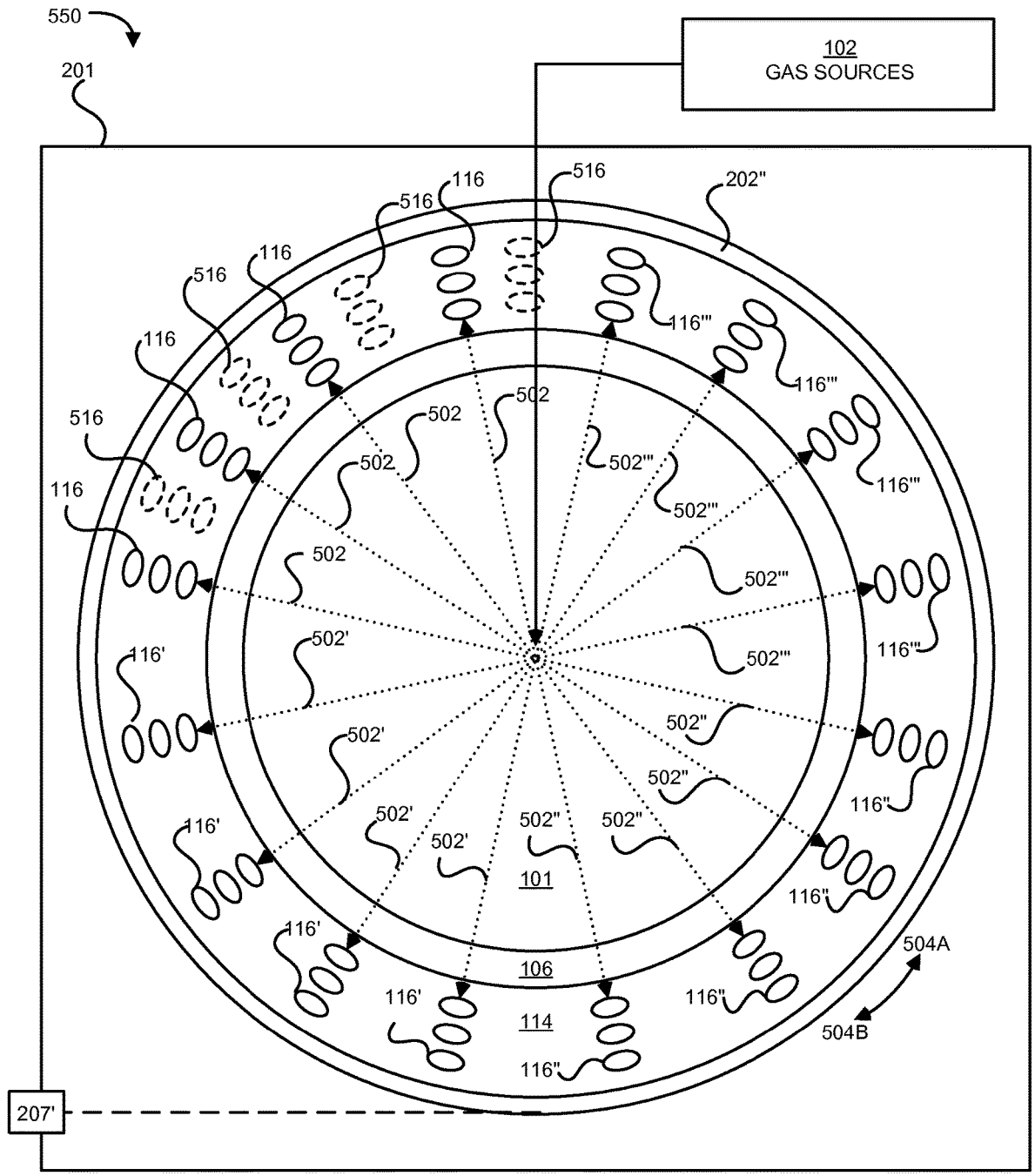
FIGS. 5E-G are simplified cross-sectional views of an alternative small volume plasma processing chamber system, in accordance with one embodiment of the present invention.
Figure 5F:
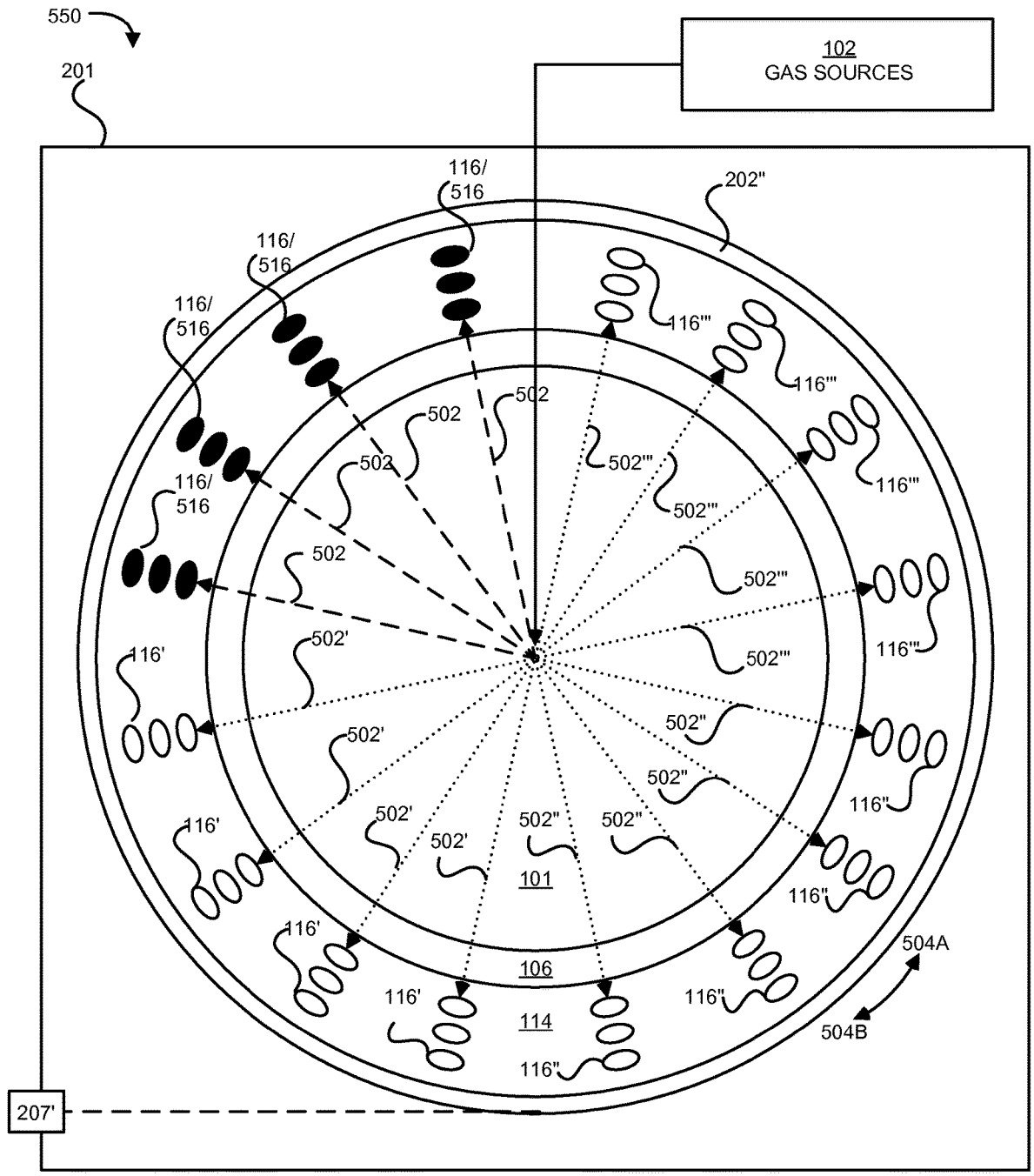
Figure 5G:
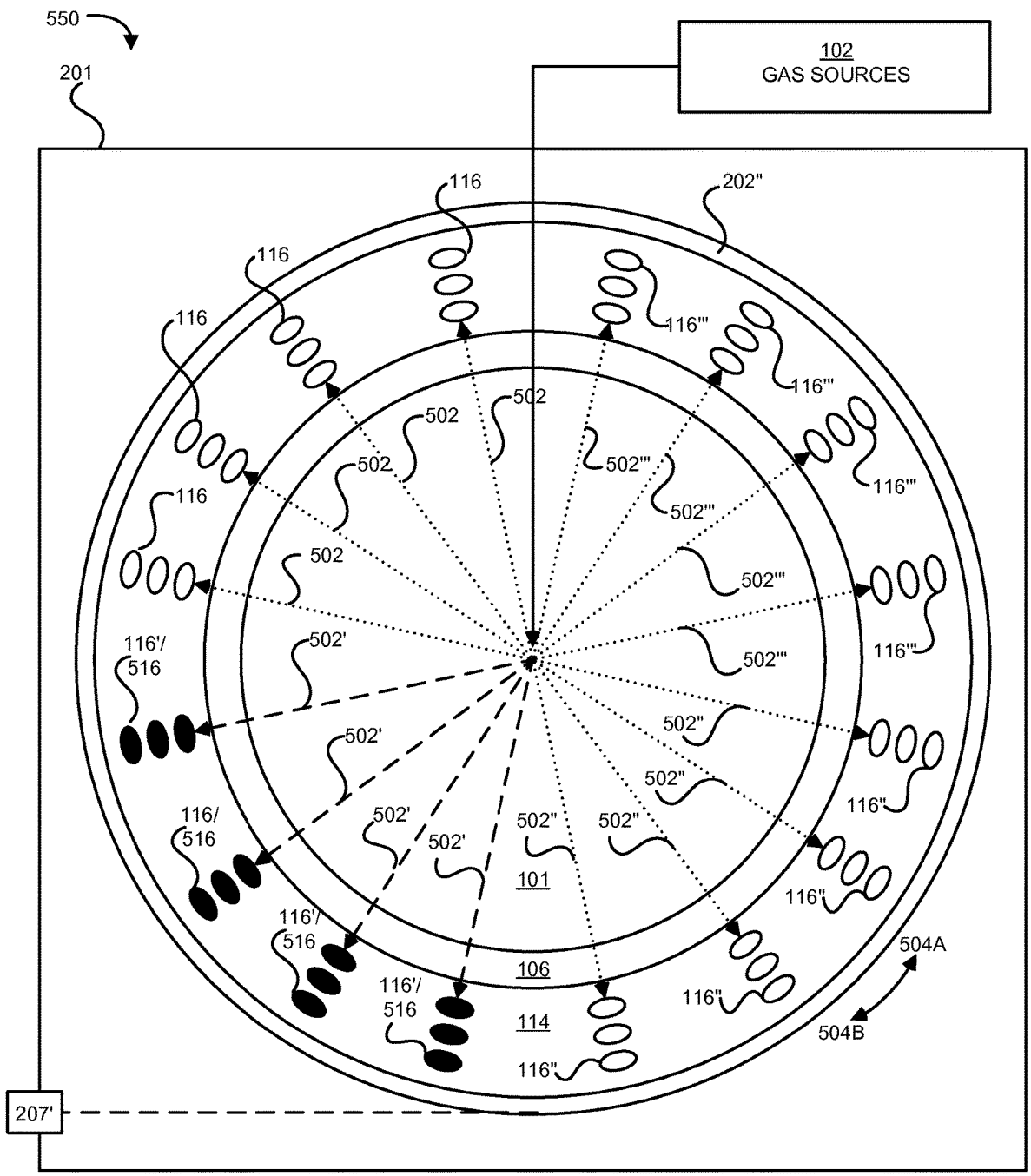

FIGS. 5E-G are simplified cross-sectional views of an alternative small volume plasma processing chamber system 550, in accordance with one embodiment of the present invention. The small volume plasma processing chamber system 550 is substantially similar to the small volume plasma processing chamber system 500 described in FIG. 5A-D, above. The primary difference is that the outlet flow through only a portion of the multiple outlet ports 116, 116', 116", 116' are restricted or unrestricted at any one time and thus allowing an asymmetrical the outlet flow operation.

By way of example, as shown in FIG. 5E all of the outlet ports 116, 116', 116", 116' are substantially fully restricted. The openings 516 in the conductance control structure 202" are shown offset in phantom because the openings are not aligned with the outlet ports 116.

Referring to FIG. 5F, the openings 516 are shifted to align with outlet ports 116 and thus only the outlet flow through the outlet ports 116 are substantially fully unrestricted, while the outlet flow through the remaining outlet ports 116', 116", 116' remains substantially fully restricted. When only the outlet flow through the outlet ports 116 is substantially unrestricted, the process gases and plasma byproducts can flow in directions 502 toward the outlet ports 116. The process gases and plasma byproducts do not flow in directions 502', 502", 502' because the outlet flow through the corresponding ports 116', 116", 116' are substantially fully restricted.

Referring to FIG. 5G, the openings 516 are shifted to align with outlet ports 116' and thus only the outlet flow through the outlet ports 116' are substantially fully unrestricted, while the remaining outlet ports 116, 116", 116' remain substantially fully restricted. When only the outlet ports 116' have the outlet flow unrestricted, the process gases and plasma byproducts can flow in directions 502' toward the unrestricted outlet ports 116'. The process gases and plasma byproducts cannot flow in directions 502, 502", 502' because the corresponding outlet ports 116, 116", 116' are substantially fully restricted.

The conductance control structure 202 can be further shifted to open selected outlet ports 116, 116', 116", 116'. It should be understood that while each portion of the outlet ports 116, 116', 116", 116' corresponds to approximately a quadrant of the plasma confinement structure 114, it should be understood that the number, shape and placement of the openings 516 in the conductance control structure 202 can be selected to restrict or un-restrict the outlet flow through as few as a single one of the outlet ports 116, 116', 116", 116'.

Controlling the outlet flow through only a selected portion of the outlet ports 116, 116', 116", 116' allows the system 550 to asymmetrically and directionally select the flow of the plasma and the processing gases across the surface of the wafer 101 being processed. By way of example, if greater concentration of plasma processing were desired in the area of the surface of the wafer corresponding to outlet ports 116", then the concentration of the process gases can be increased and input to the plasma processing volume 110 and with the outlet flow through the outlet ports 116" substantially fully unrestricted to cause the flow in directions 502". Similarly, the concentration of the process gases can be decreased and input to the plasma processing volume 110 and with the outlet ports 116" substantially fully restricted to cause the flow in directions 502" to reduce the plasma processing rate in the area of the surface of the wafer corresponding to outlet ports 116".

Opening only a selected portion of the outlet ports 116, 116', 116", 116'" also allows for an asymmetrical, non-radial distribution of the pressure and concentration of the process gases, plasma and byproducts. The non-radial distribution can be manipulated to minimize some of the radial plasma processing non-uniformity effects that are common in plasma processing chambers.

Figure 6:
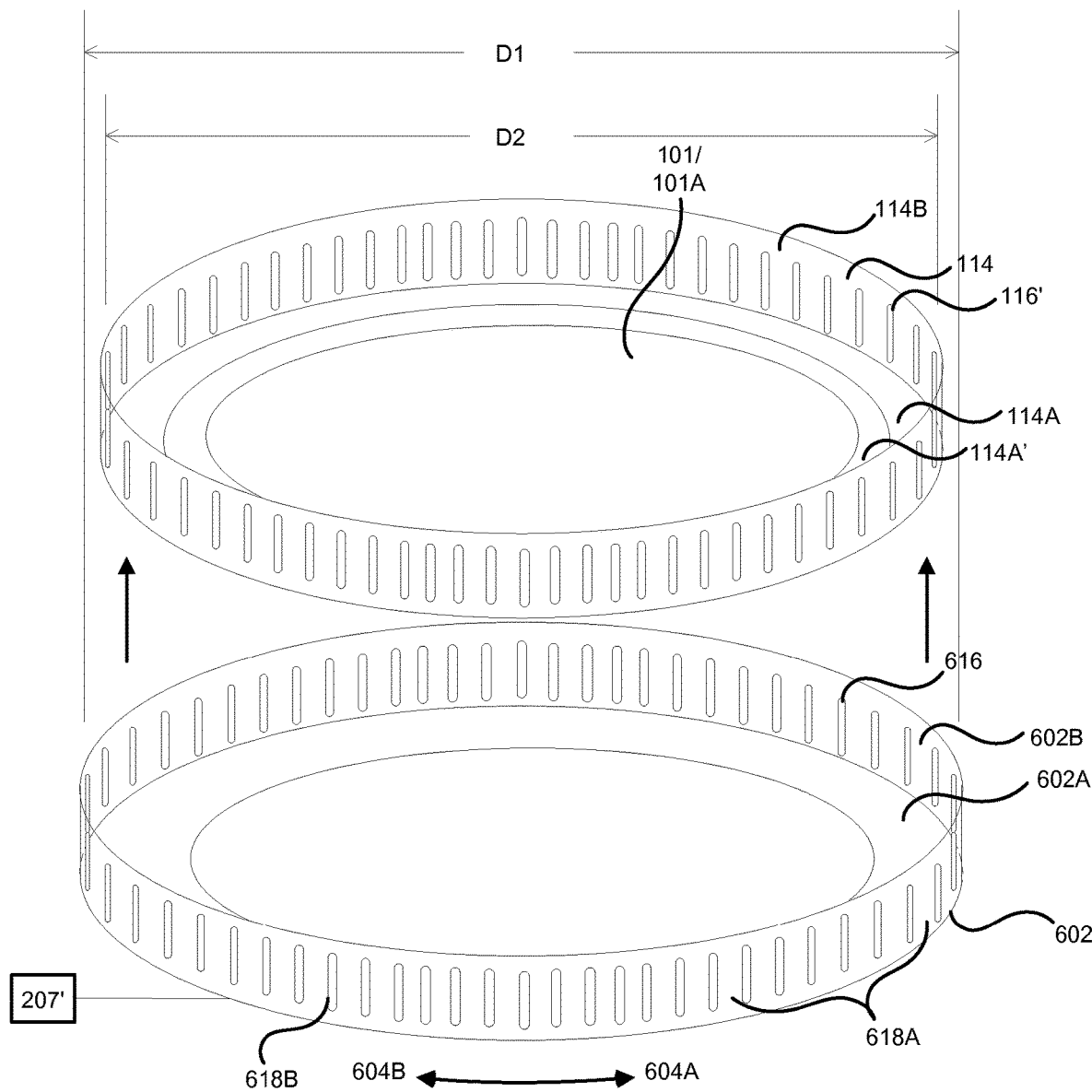
FIG. 6 is an exploded view of a conductance control structure, in accordance with one embodiment of the present invention.

FIG. 6 is an exploded view of a conductance control structure 602, in accordance with one embodiment of the present invention. The conductance control structure 602 is somewhat similar to the conductance control structure 202 described above, however the outlet ports 116' are formed in the substantially vertical outer periphery 114B of the plasma confinement structure 114. The conductance control structure 602 includes at least some openings 616 in a corresponding, substantially vertical portion 602B.

The conductance control structure 602 has a diameter D1 that is slightly wider than a diameter D2 of the plasma confinement structure 114. In operation, the plasma confinement structure 114 will be nested within the conductance control structure 602. The conductance control structure 602 can be rotated or shifted in directions 604A and 604B by the positioning actuator 207' to align at least one of the openings 616 to at least one of the outlet ports 116' to increase or decrease the restriction to the outlet flow through the outlet port.

While openings 616 are shown substantially evenly distributed around the conductance control structure 602, it should be understood that the openings 616 may be unevenly distributed around the conductance control structure 602. Alternatively, the openings 616 may only be included in one or more radial portions 618A, 618B or segments of the periphery of the conductance control structure 602, similar to the plasma processing chamber system 550 described in FIGS. 5E-5G above and thus provide an asymmetrical and directional selection of the flow of the plasma and the processing gases across the surface of the wafer 101 being processed.

It should also be understood that the conductance control structure 602 can also include openings 616 in the substantially horizontal portion 602A. The openings 616 in the substantially horizontal portion 602A correspond to outlet ports 116 in the substantially horizontal portion 114A of the plasma confinement structure 114 as described in the preceding figures.

Figure 7:
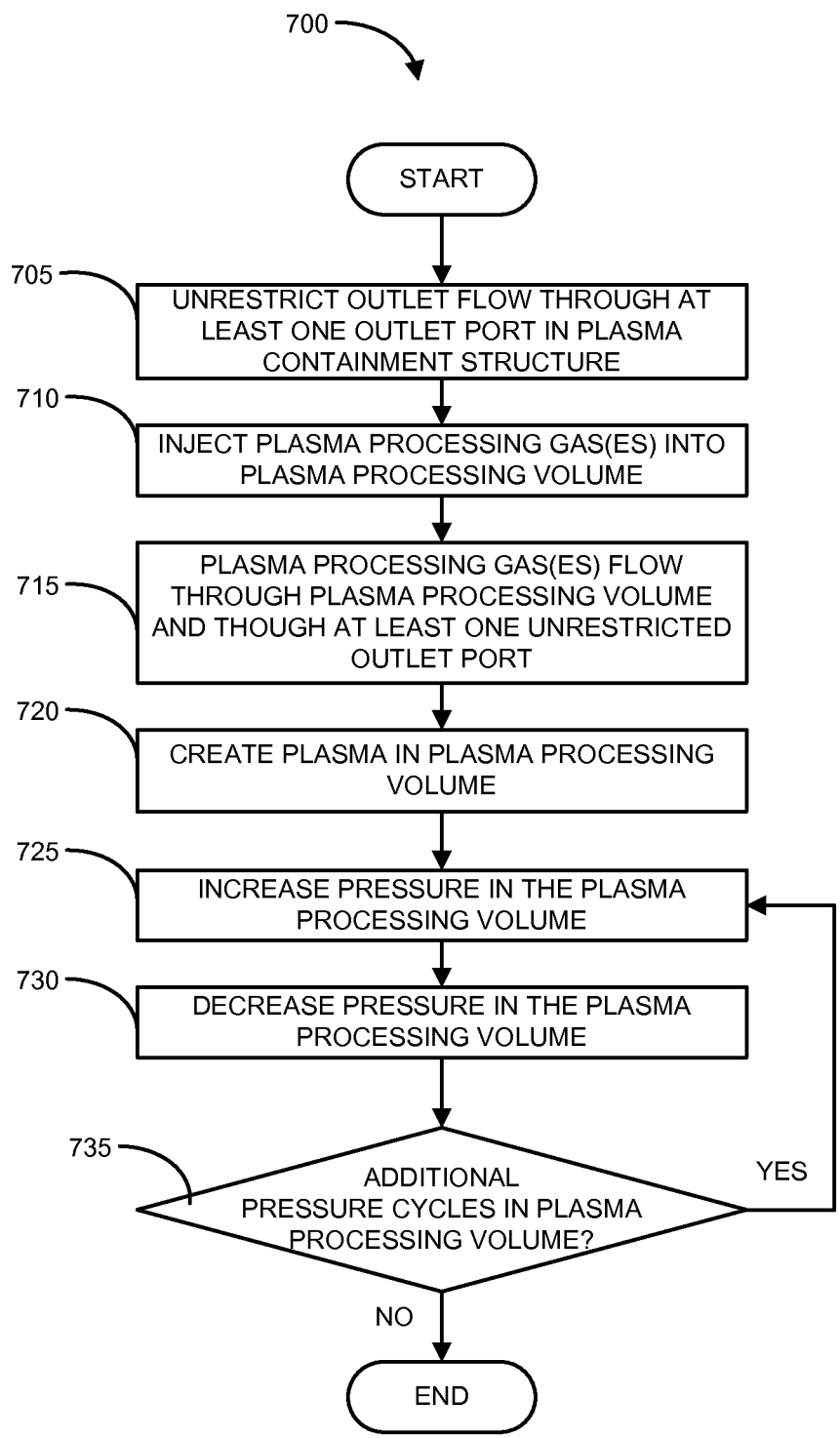
FIG. 7 is a flowchart diagram that illustrates the method operations performed in varying the pressure within the plasma processing volume, in accordance with embodiments of the present invention.

FIG. 7 is a flowchart diagram that illustrates the method operations 700 performed in varying the pressure within the plasma processing volume 110, in accordance with embodiments of the present invention. In an operation 705, the outlet flow through at least one outlet port 116, 116' in the plasma confinement structure 114 is substantially fully unrestricted. The outlet flow through the least one port outlet 116, 116' in the plasma confinement structure 114 can be substantially fully unrestricted by moving the corresponding conductance control structure 202, 302, 402, 202", 602 so as to align the at least one outlet port with or create corresponding openings 216, 316, 516 and/or 616.

In an operation 710, one or more processing gases are injected into the plasma processing volume 110. In an operation 715, the process gases flow in at least one substantially radial direction 112 through the plasma processing volume 110 toward one or more outlet ports 116, 116' in the plasma confinement structure 114 at the periphery of the plasma processing volume.

In an operation 720, a plasma is formed in the plasma processing volume 110 by applying an RF signal to at least one of the top electrode 108 or the substrate support 106 (e.g. bottom electrode) from the respective RF sources 117B, 117A. The flow of the process gases distribute the ions, radicals and neutrals generated by the plasma.

In an operation 725, the pressure is increased in the plasma processing volume 110. The pressure in the plasma processing volume 110 can be increased by substantially fully restricting the outlet flow through least a portion of the at least one outlet port 116, 116'. The outlet flow through the at least one outlet port 116, 116' can be substantially fully restricted by shifting the conductance control structure 202, 302, 402, 202", 602 to restrict or block the at least one outlet port as shown in the figures above.

The pressure in the plasma processing volume 110 can increase at a rate of up to about 30 mtorr/100 ms. The amount of pressure increase can also be controlled by varying the flowrate of the process gases from the process gas sources 102 into the plasma processing volume 110.

As discussed above, as little as about 5 mtorr pressure change, either an increase or a decrease, can make significant process variations due to the corresponding changes in the plasma chemistries. By way of example, as the pressure changes in the plasma processing volume 110, the ratio of ions, radicals and neutrals and the plasma density varies.

As the pressure reaches a desired set point, one or both of the RF sources 117A, 117B can optionally remain constant, be modulated, reduced, enabled or disabled operational state to also allow further selection of the ratios of ions, radicals and neutral species in the plasma.

In an operation 730, the pressure is decreased in the plasma processing volume 110. The pressure in the plasma processing volume 110 can be decreased by reducing the restriction of the outlet flow through at least a portion of the outlet ports 116, 116'. The outlet flow through the outlet ports 116, 116' can be increased (e.g., less restricted) by shifting the conductance control structure 202, 302, 402, 202" 602 to align or create openings to correspond to the outlet ports 116, 116'. Reducing the restriction of the outlet flow through the outlet ports 116, 116' allows the process gases and the plasma byproducts to rush toward the outlet ports and the outlets, e.g., vacuum pumps, of the plasma processing chamber 201. The pressure in the plasma processing volume 110 can decrease at a rate of up to about 20 mtorr/100 ms. The rate of change of the pressure can be selected from between about 1 mtorr/100 ms to about 20 mtorr/100 ms with movement of the conductance control structure. For a rotary type configuration such as shown in FIGS. 3F and 5A-6, the conductance change could be even faster than 20 mtorr/100 ms. Reducing the pressure in the plasma processing volume 110 moves plasma byproducts away from a center region 120 of plasma processing volume. As a result, some radial non-uniformity effects of the plasma processing can be reduced or eliminated.

As described above, an asymmetrical flow of the processing gases uses the non-uniform nature of asymmetrical venting, e.g., substantially fully unrestricted outlet flow through only a selected portion or segment of the outlet ports 116, 116', can vary the etch rate in a corresponding asymmetrical pattern. The asymmetrical outlet flow through outlet ports can be selectively moved around the surface being processed to counteract radial non-uniformities.

As the pressure reaches a desired set point, one or both of the RF sources 117A, 117B can optionally remain constant, be modulated, reduced, enabled or disabled operational state to further select or control the ratios of ions, radicals and neutral species in the plasma.

In an operation 735, the method operations can end if no additional pressure cycles are required in the plasma processing volume 110. Alternatively, if additional pressure cycles are required in the plasma processing volume 110 then the method operations can continue in an operation 725 above.

Figure 8A:
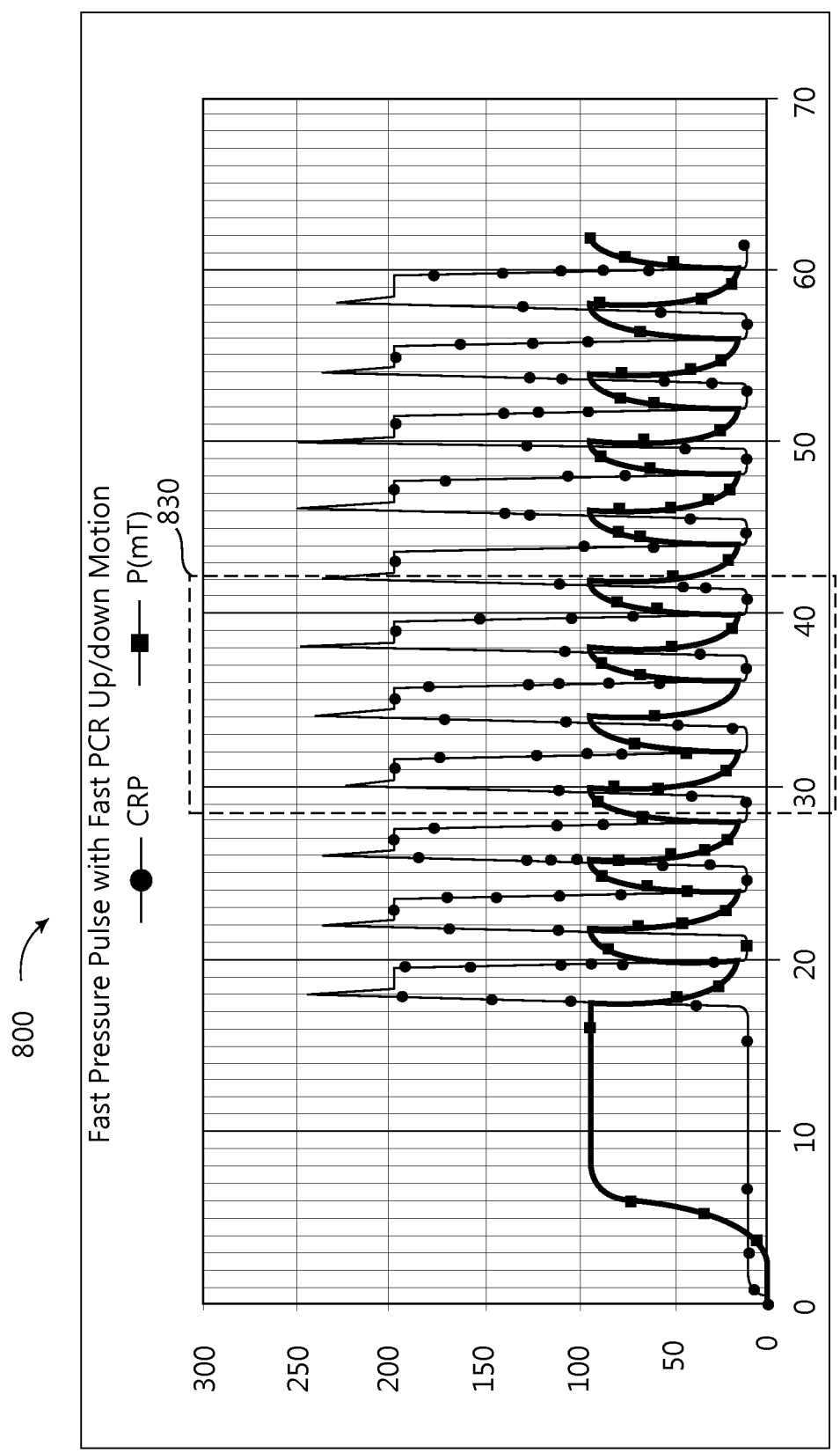
FIG. 8A is graphical representation of multiple pressure cycles within the plasma processing volume, in accordance with embodiments of the present invention.
Figure 8B:
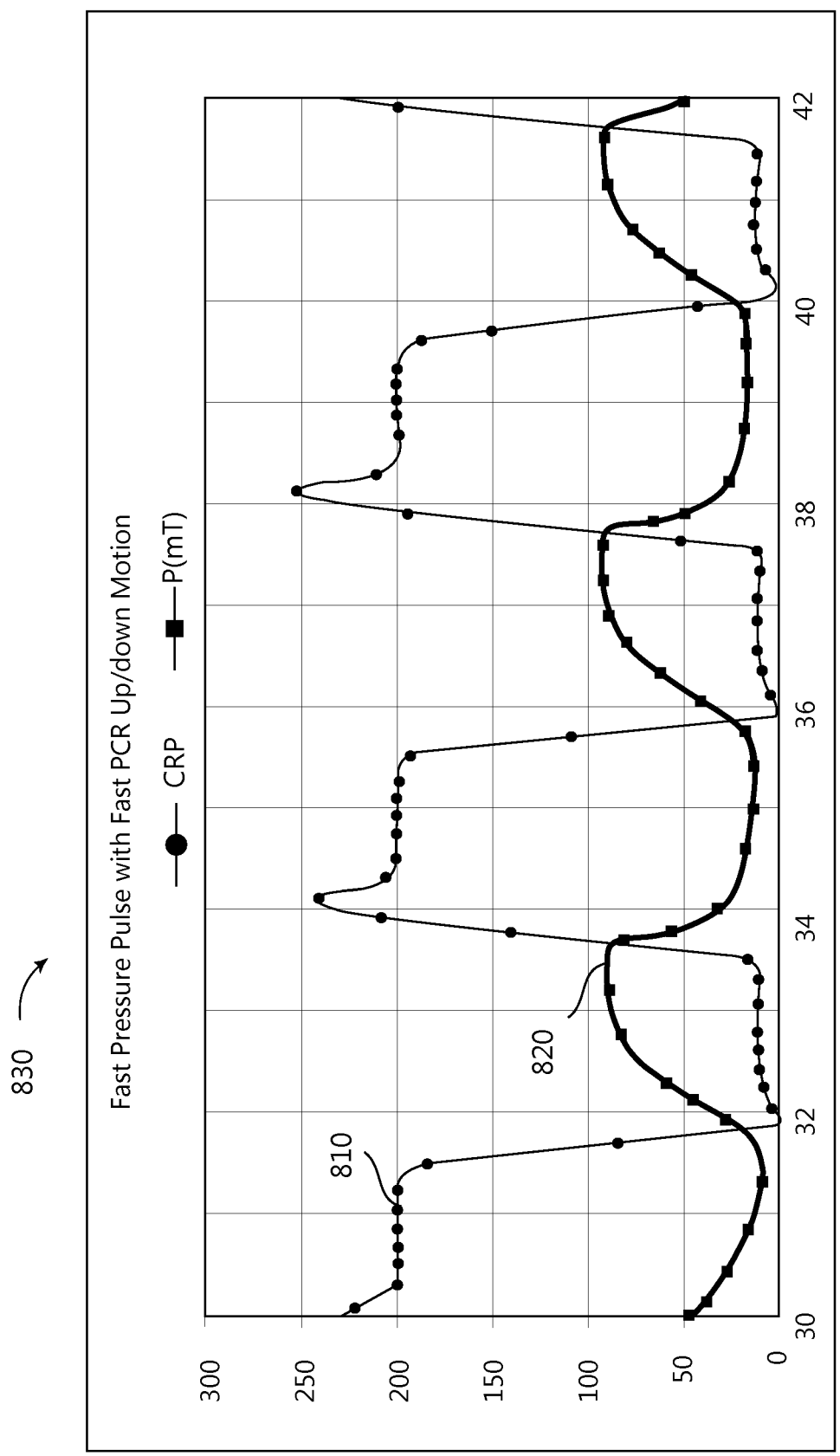
FIG. 8B is detailed view of a portion of the graphical representation of multiple pressure cycles within the plasma processing volume, in accordance with embodiments of the present invention.

FIG. 8A is graphical representation 800 of multiple pressure cycles within the plasma processing volume 110, in accordance with embodiments of the present invention. FIG. 8B is detailed view of a portion 830 of the graphical representation 800 of multiple pressure cycles within the plasma processing volume 110, in accordance with embodiments of the present invention. As described above, the pressure within the plasma processing volume 110 can be varied at a rate of about 10 Hz or more, depending on the desired pressure change and the possible rate of pressure change. Each cycle of the pressure change can be accomplished by a cycle of closing the ports 116, 116' and opening the ports. The conductance control structure 202, 302, 402, 202" 602 of the various embodiments described above can be cycled through the port 116, 116' substantially fully unrestricted position and substantially fully restricted position and various positions between fully restricted and fully unrestricted to provide the desired cycle of the pressure change. By way of example, the positioning actuator 207 can alternate the conductance control structure 202 in directions 204A and 204B. Similarly, conductance control structures 202" and 602 can be rotated or stepped at a substantially continuous rate to provide the desired cycle and rate of the pressure change in the plasma processing volume 110. The flow rate of the process gases from the process gas source 102 into the plasma processing volume 110 can also be selected to increase or decrease the pressure within the plasma processing volume.

Referring to FIGS. 8A and 8B, a control signal graph 810 is shown superimposed to a pressure graph 820 of the pressure within the plasma processing volume 110. The control signal graph 810 shows the control signals to increase and decrease restriction on the outlet flow through the outlet ports 116, 116'. Time in seconds is shown across the horizontal axis. At time of about 3.15 sec, the control signal substantially fully restricts the outlet flow through the outlet ports 116, 116'. At about time 3.2 sec, the pressure begins a gradual increase from about 20 mtorr to about 90 mtorr at time 3.3 sec.

Referring to FIG. 8B, time in seconds is shown across the horizontal axis. At end of $32^{nd}$ second the pressure begins to change from 20 mT and at end of $33^{rd}$ second, the pressure has risen to about 90 mT. This pressure change is 70 mT/1 sec or 70 mT/1000 ms. FIG. 8B shows a time delay error due to lack of fast pressure measurement instruments. However, the actual pressure change is proportional to change in conductance control structure position, such that the actual rate of change in pressure is about 70 mT/500 ms as is graphed in FIG. 8C.

The pressure is maintained at about 90 mtorr. At a time of about 33.6 sec the control signal switches to reduce the restriction on the outlet flow through the outlet ports 116, 116'. At a time of about 33.7 sec, the pressure begins to decrease to arrive at about 20 mtorr at a time of about 35 sec. The pressure stabilizes at about 20 mtorr until the control signal increases the restriction on the outlet flow through the outlet ports 116, 116' at time about 36 sec. The cycle then repeats.

Figure 8C:
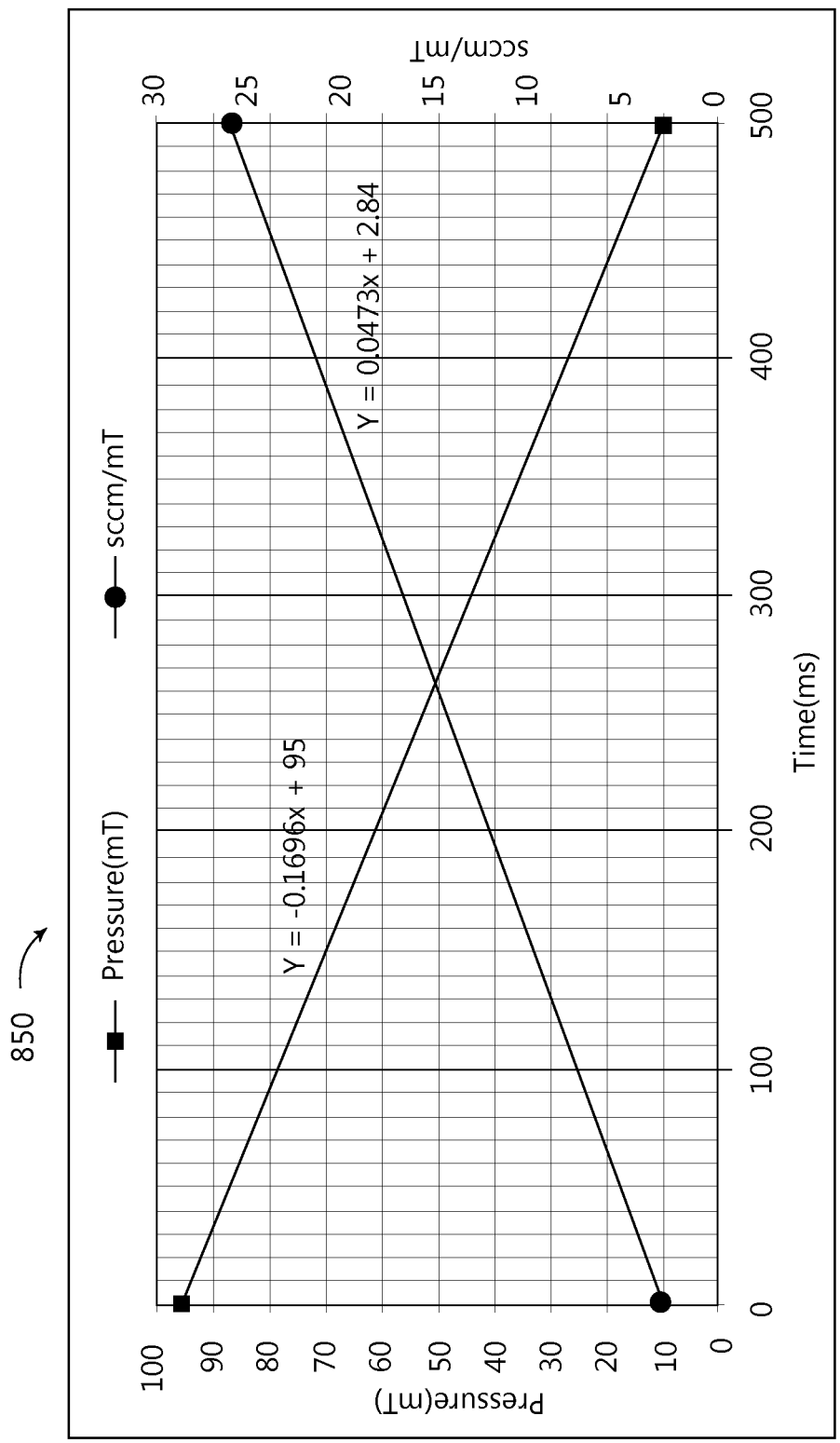
FIG. 8C is a graph representation of the rate of pressure change, in accordance with embodiments of the present invention.

FIG. 8C is a graph representation 850 of the rate of pressure change, in accordance with embodiments of the present invention. As shown the rate of pressure change in the plasma processing volume 110 is about 17 mtorr per 100 msec. Thus allowing up to about a 17 mtorr pressure change cycle at a rate of about 10 Hz.

FIGS. 9A-9F illustrate a pressure wave progression through the plasma processing volume 110, in accordance with embodiments of the present invention. Beginning with FIG. 9A, the plasma processing volume 110 is pressurized to an increased pressure because the outlet flow through the outlet ports 116 is closed. The outlet flow through the outlet ports 116 has been sufficiently restricted for a time sufficient to pressurize the plasma processing volume 110 substantially uniformly such that each respective portion 120, 122, 124, 126 of the plasma processing volume has an equal pressure.

Figure 9A:
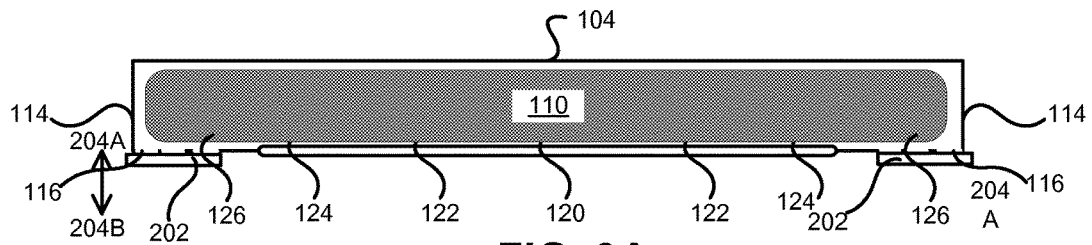
FIGS. 9A-9F illustrate a pressure wave progression through the plasma processing volume, in accordance with embodiments of the present invention.
Figure 9B:
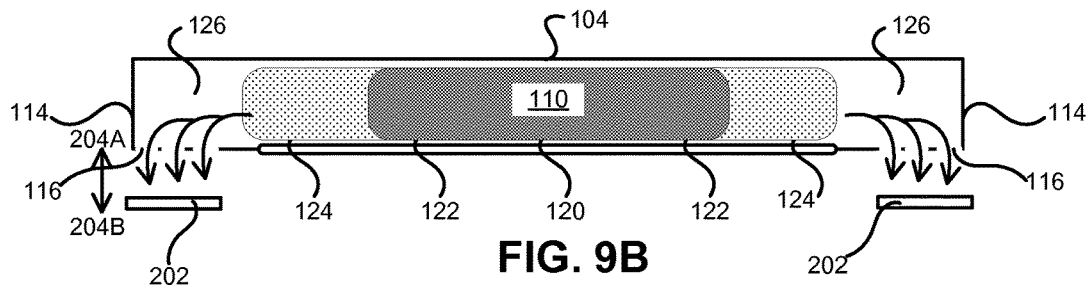

At a time T1, when the outlet flow through the outlet ports 116 is substantially fully unrestricted, as shown in FIG. 9B, the process gases and byproducts are pushed away from the central portion 120 and toward the outlet ports as the pressure in the outermost portions 126 of the plasma processing volume 110 is reduced to substantially the same pressure as the remainder of the processing chamber 201, external from the plasma processing volume. The pressure in portions 124 is slightly reduced.

Figure 9C:
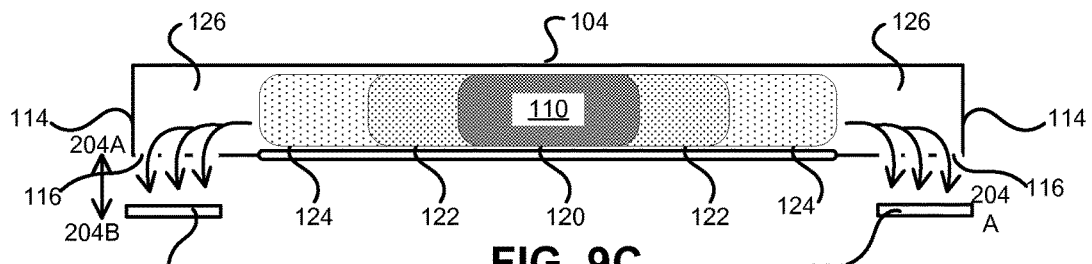

At a time T2, a short time after T1, as shown in FIG. 9C, more of the process gases and byproducts are pushed away from the central portion 120 and toward the outlet ports. The pressure in portions 122 and 124 are each slightly reduced.

Figure 9D:
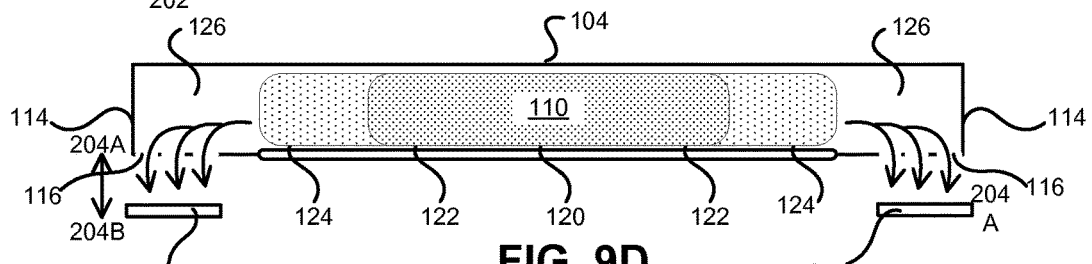

At a time T3, a short time after T2, as shown in FIG. 9D, more of the process gases and byproducts are pushed away from the central portion 120 and toward the outlet ports. The pressure in portions 120, 122 and 124 are each slightly reduced.

Figure 9E:
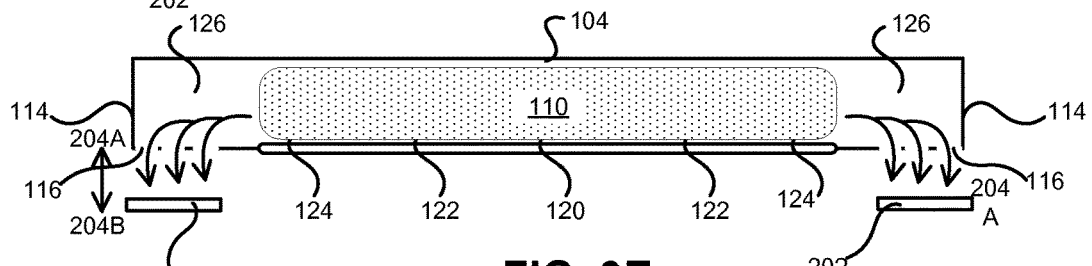

At a time T4, a short time after T3, as shown in FIG. 9E, more of the process gases and byproducts are pushed away from the central portion 120 and toward the outlet ports. The pressure in portions 120, 122 and 124 are each again slightly reduced.

Figure 9F:
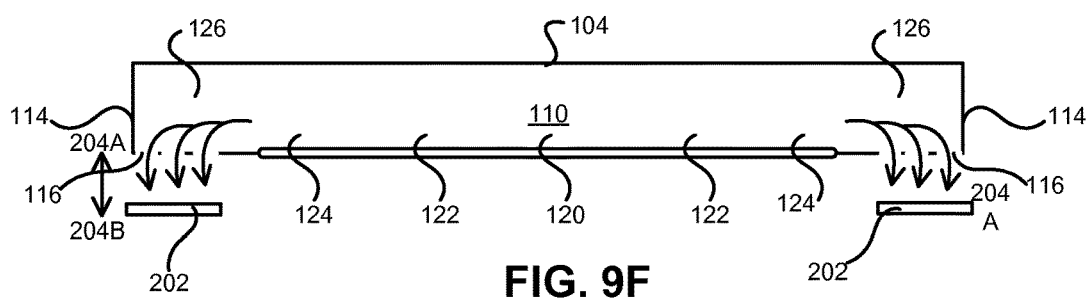

At a time T5, a short time after T4, as shown in FIG. 9F, more of the process gases and byproducts are pushed away from the central portion 120 and toward the outlet ports. The pressure in portions 120, 122 and 124 of the plasma processing volume 110 are reduced to substantially the same pressure as the remainder of the processing chamber 201 external from the plasma processing volume.

Figure 10:
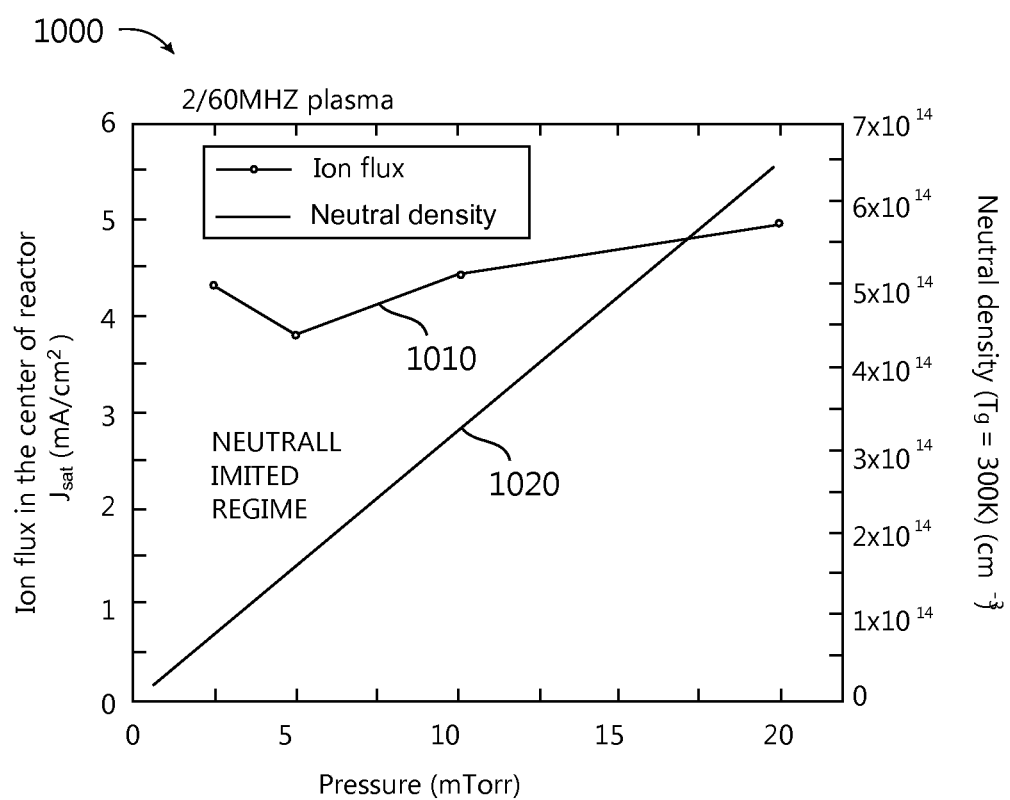
FIG. 10 is a graphical representation of ion and neutral flux densities, in accordance with embodiments of the present invention.

Pressure changes in the plasma processing volume 110 determine the ratios of ions, radicals and neutral species in the plasma. FIG. 10 is a graphical representation 1000 of ion and neutral flux densities, in accordance with embodiments of the present invention. The ion flux density graph 1010 is a substantially constant density, e.g., about 4.5, over a range of pressures between about 2 and about 20 mtorr. The neutral flux density graph 1020 varies widely from a density less than about $1 \times 10^{14}$ to more than about $6.5 \times 10^{14}$. The neutral flux density increases substantially linearly with pressure.

As shown in FIG. 10, a variation from 5 mtorr to 15 mtorr would have substantially the same ion flux density. In contrast, the neutral flux density would vary from about 1 to about 4, i.e., a factor of 4 times the density at the 15 mtorr, higher pressure, as compared to the 5 mtorr lower pressure. As a result, this 10 mtorr manipulation or modulation of the pressure gives a only limited selection of the ion flux density while at the same time gives broad selection to the neutral flux density. The etching performance of the different ratios can then be selected by the corresponding pressure of the plasma processing volume 110.

Figure 11A:
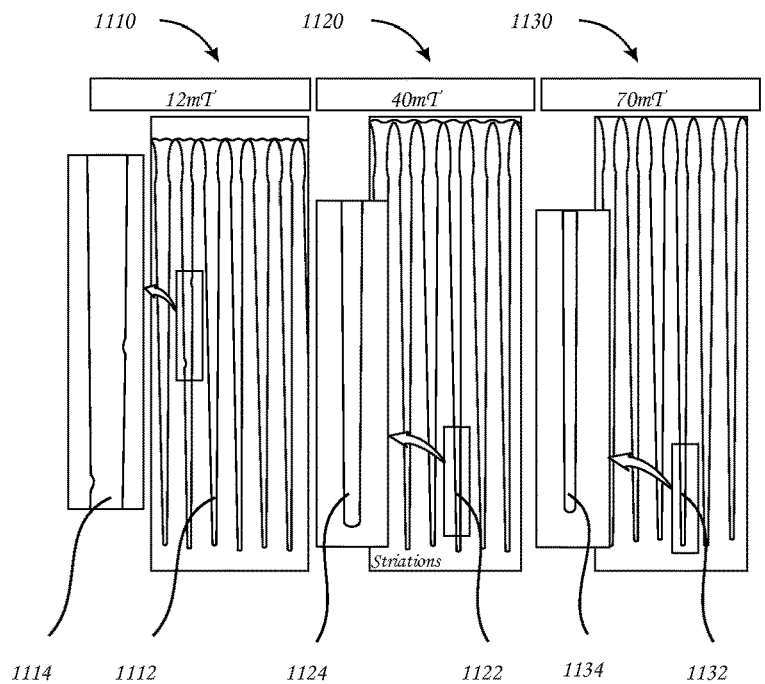
FIG. 11A is a series of photos of prior art, constant pressure etch process results.

FIG. 11A is a series of photos of prior art, constant pressure etch process results. The first view 1110 is a first etch process executed at a constant 12 mtorr. Each of the features 1112 has a tapered shape with the lower portion of the feature coming almost to a point when a wider, flatter bottom portion would be a much preferred result. A detailed view 1114 shows an acceptable profile in the mid depth of the feature. A preferred feature profile would have the acceptable profile of the mid depth (e.g., smooth, parallel sides) of the feature throughout the full depth of the feature.

The second view 1120 is a second etch process executed at a constant 40 mtorr. Each of the features 1122 has a less tapered shape than the features 1112, however undesirable striation type non-uniformities are formed in the mid depth profile 1124. The third view 1130 is a third etch process executed at a constant 70 mtorr. Each of the features 1132 has a tapered shape similar to the features 1112, however undesirable striation type non-uniformities are also formed in the mid depth profile 1134.

Figure 11B:
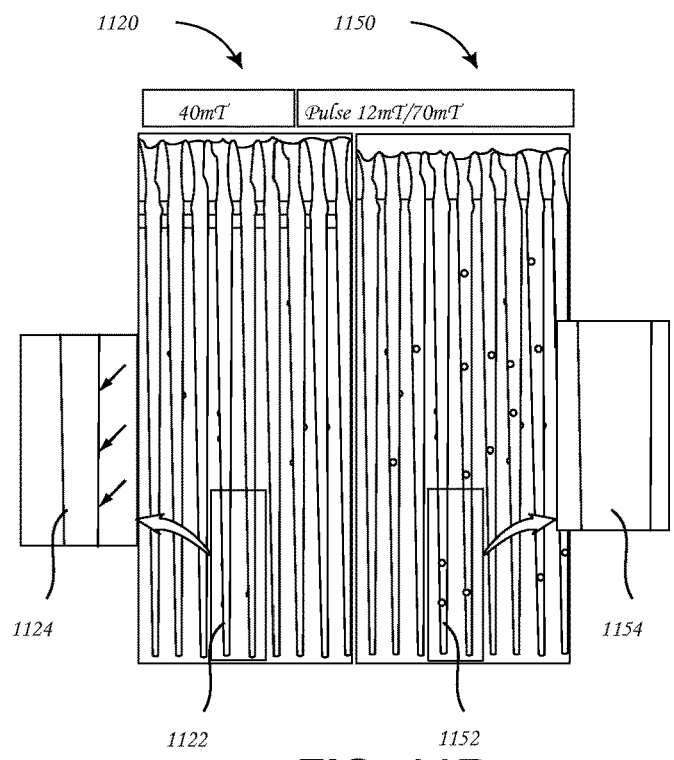
FIG. 11B compares the constant pressure etch process to a pulsed pressure etch process, in accordance with embodiments of the present invention.

FIG. 11B compares the constant pressure etch process 1120 to a pulsed pressure etch process 1150, in accordance with embodiments of the present invention. The pulsed pressure etch process 1150 varies the etch pressure within the plasma processing volume 110 from between about 12 mtorr and about 70 mtorr. The pulsed pressure etch process 1150 yields an improved profile similar to the 40 mtorr constant pressure etch process 1120 but also eliminates the undesirable striations as shown in the details view 1154 and further squares off the lower portions of the features 1152.

Figure 12A:
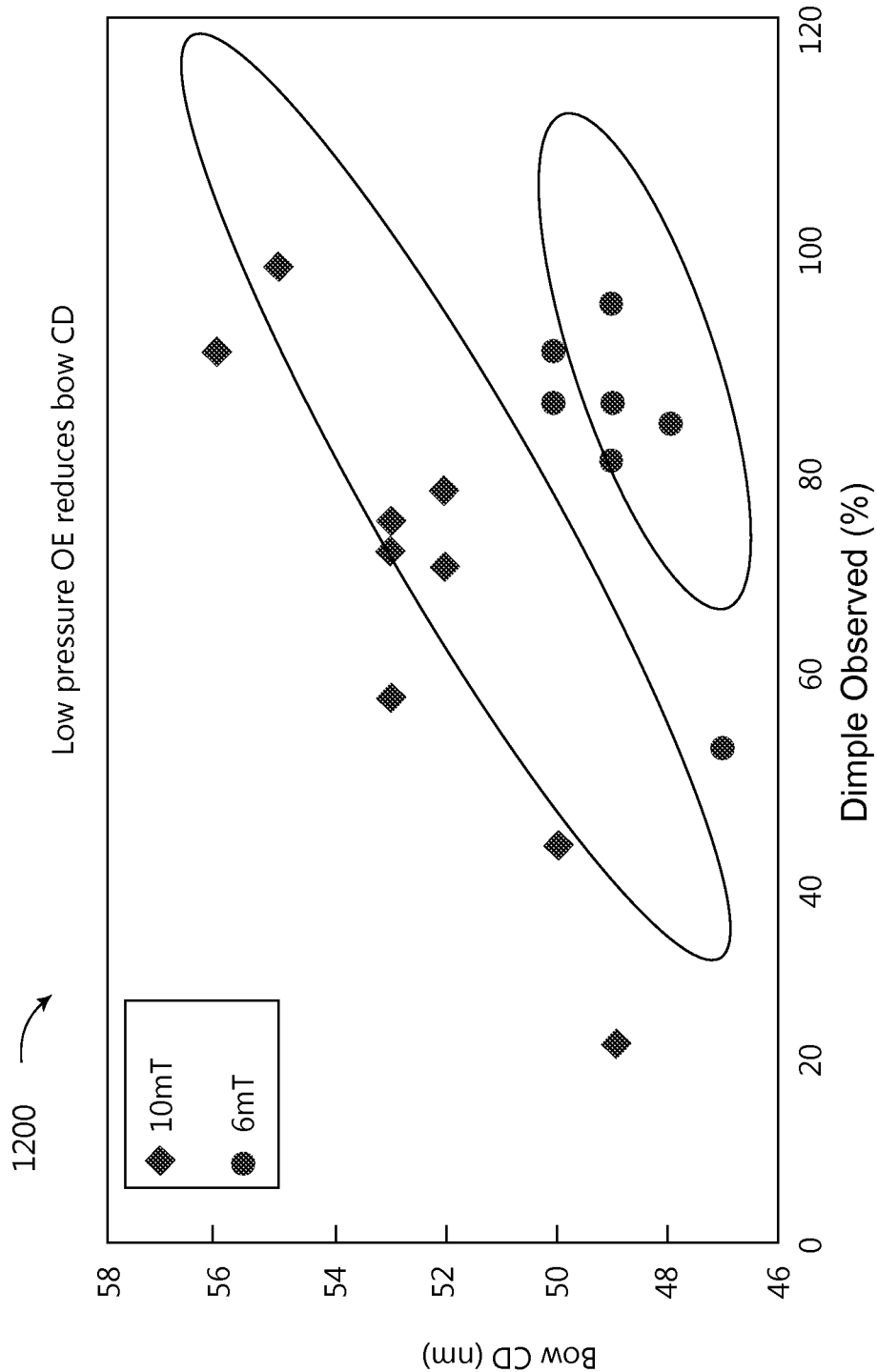
FIG. 12A is a graph showing the relationship of pressure and lateral etching, in accordance with embodiments of the present invention.
Figure 12B:
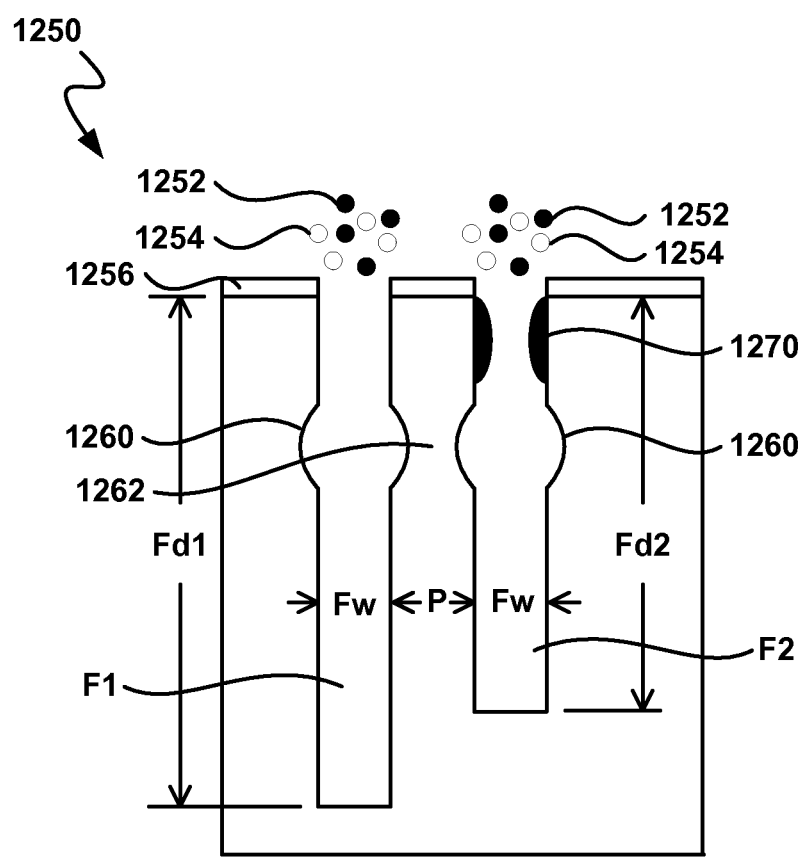
FIG. 12B is a simplified schematic diagram of high aspect ratio contact features, in accordance with embodiments of the present invention.

FIG. 12A is a graph 1200 showing the relationship of pressure and lateral etching, in accordance with embodiments of the present invention. FIG. 12B is a simplified schematic diagram 1250 of high aspect ratio contact features, in accordance with embodiments of the present invention. In an etch process to form a high aspect ratio contact (HARC), such as for a DRAM device, as the critical dimension (i.e., width Fw of the features F1, F2) becomes smaller and the pitch P between the features F1, F2 is decreased (i.e., features are more closely spaced), an undesirable lateral etch can occur near the opening or top end of the features.

The lateral etch etches into the sidewalls of the features F1, F2 to form a bowed sidewall 1260. If the lateral etch occurs too quickly, then the bowed sidewall 1260 can form a hole in the area 1262 between the adjacent features F1 and F2 and thus result in a short circuit between the two adjacent features. Therefore, the lateral etching needs to be minimized while also improving the bottom profile and depth Fd1 of the feature F1 as compared to the lesser depth Fd2 of feature F2.

The graph 1200 as shown in FIG. 12A illustrates the effect of the operating pressure and the sidewall bowing 1260 and the depth and profile of the lower end of the features F1, F2. At lower pressures, fewer ions 1252, 1254 deflect off other ions due to the reduce density of ions present in the lower pressure. Thus, at lower pressures the directionality of the ions 1252, 1254 entering the features F1, F2 is improved and more ions reach the bottom of the feature to perform the desired directional etch. Further, as more ions 1252, 1254 enter the features, less ions deflect off the mask layer 1256 to impinge on the sidewall to produce the sidewall bowing 1260 (e.g., undesirable lateral etch)

During the etch process, polymer species (e.g., fluorocarbon or hydrocarbon based depending on the etch process chemistry used) may be produced. The polymer species have a high sticking coefficient and tend to build up as polymer deposits 1270 near the top or opening of the features F1, F2. In a selected etching chemistry the polymer deposits 1270 have a low sticking coefficient and thus do not adhere to the sides of feature F1. Increasing the temperature of the substrate 101 can also reduce the surface mobility and thus substantially prevent the formation of the polymer deposits 1270. High energy ions from the plasma can also remove the polymer deposits 1270. Yet another way to remove the polymer deposits 1270 is to perform an oxygen or fluorine radical etch such as by injecting O2 or NF3, respectively between the main etch processes.

Figure 13:
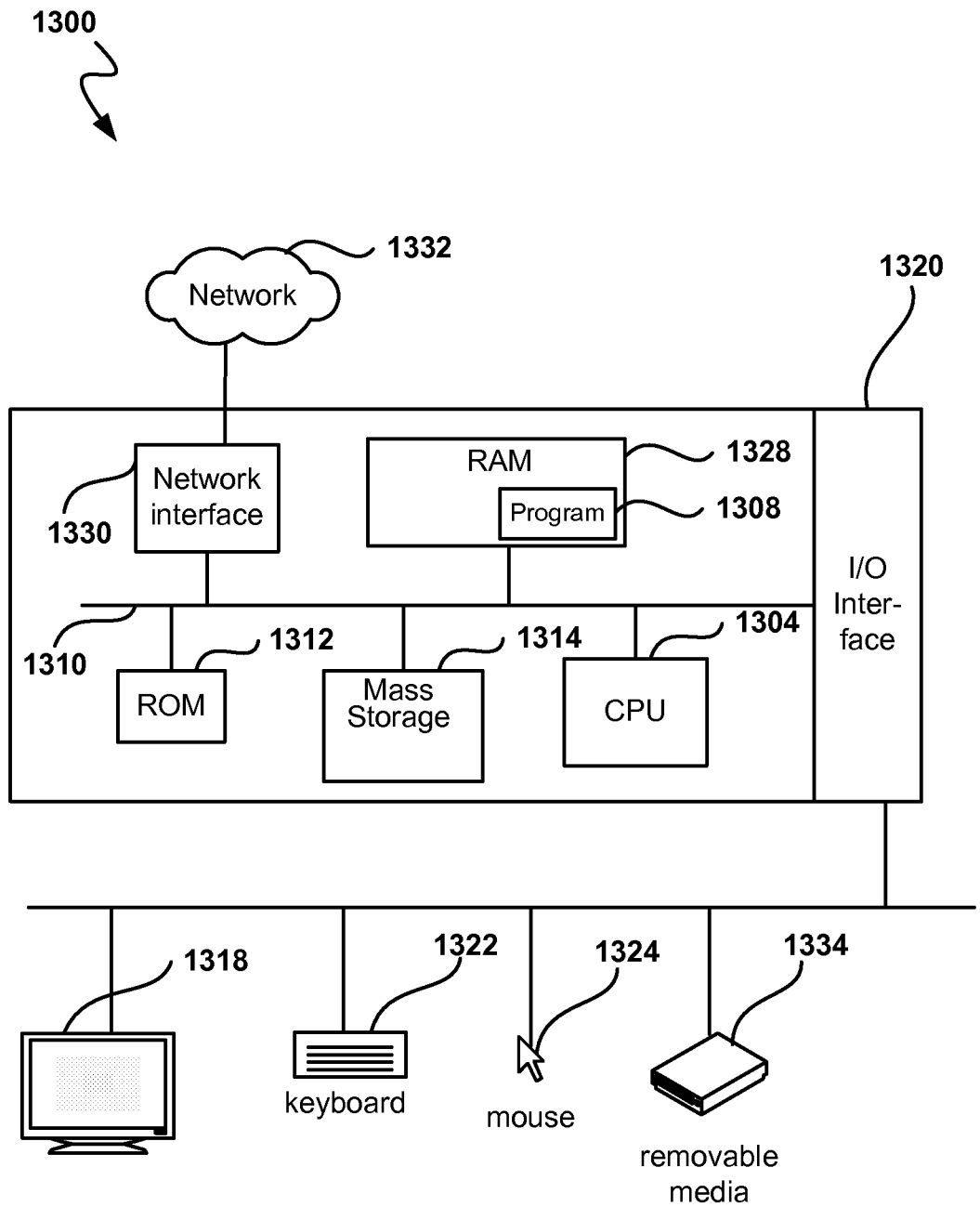
FIG. 13 is a simplified schematic diagram of a computer system in accordance with embodiments of the present invention.

FIG. 13 is a simplified schematic diagram of a computer system 1300 in accordance with embodiments of the present invention. The computer system 1300 is an exemplary computer system such as may be included in the controller 119 described above. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1304, which is coupled through bus 1310 to random access memory (RAM) 1328, read-only memory (ROM) 1312, and mass storage device 1314. Phase control program 1308 resides in random access memory (RAM) 1328, but can also reside in mass storage 1314 or ROM 1312.

Mass storage device 1314 represents a persistent data storage device such as a floppy disc drive or a fixed disc drive, which may be local or remote. Network interface 1330 provides connections via network 1332, allowing communications with other devices. It should be appreciated that CPU 1304 may be embodied in a general-purpose processor, a special purpose processor, or a specially programmed logic device. Input/Output (I/O) interface provides communication with different peripherals and is connected with CPU 1304, RAM 1328, ROM 1312, and mass storage device 1314, through bus 1310. Sample peripherals include display 1318, keyboard 1322, cursor control 1324, removable media device 1334, etc.

Display 1318 is configured to display the user interfaces described herein. Keyboard 1322, cursor control 1324, removable media device 1334, and other peripherals are coupled to I/O interface 1320 in order to communicate information in command selections to CPU 1304. It should be appreciated that data to and from external devices may be communicated through I/O interface 1320. The embodiments can also be practiced in distributed computing environments where tasks are performed by remote processing devices that are linked through a wire-based or wireless network.

Synchronizing Pressure Change and Bias Change

Figure 14A:
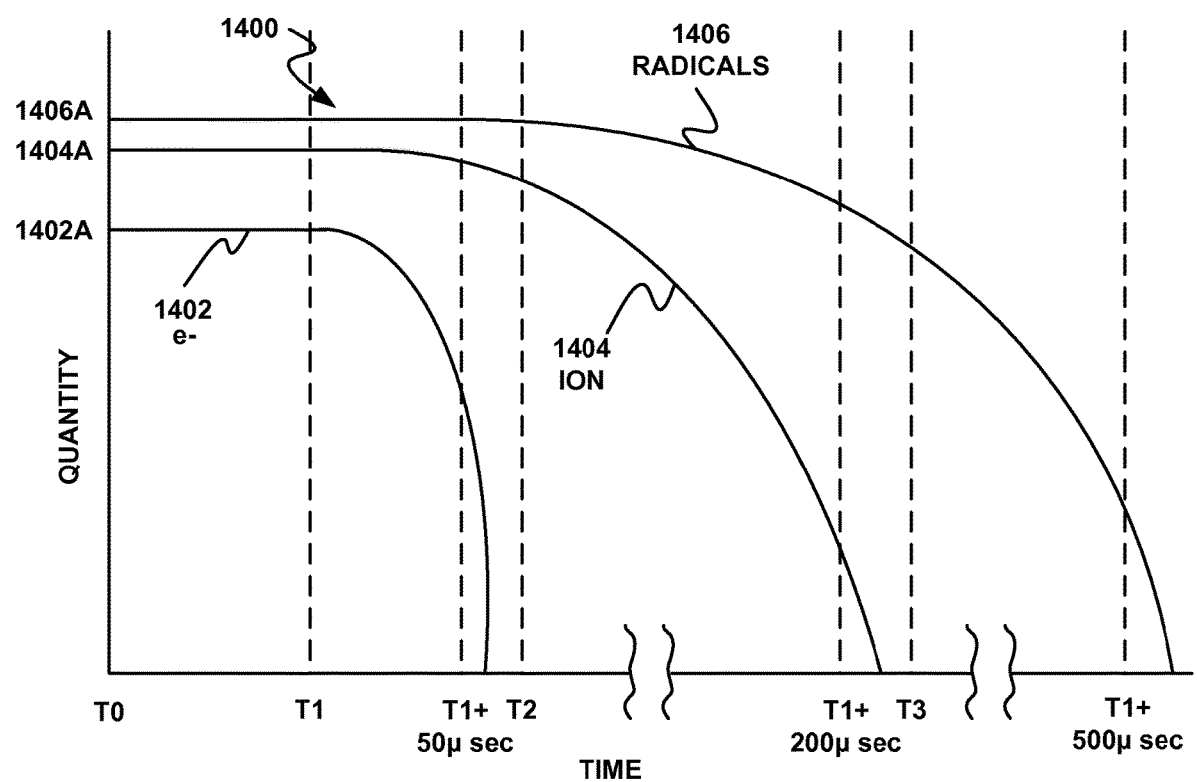
FIG. 14A is a graphical representation of the decay rates of electrons, ions, radicals, in accordance with embodiments of the present invention.

Changing the pressure of the plasma processing volume 110 can manipulate the ratios of electrons, ions, radicals and neutrals as described above. Modulating (i.e., varying power between 0 and full power) the one or more RF sources 117A, 117B can also manipulate the ratios of electrons, ions, radicals over time. FIG. 14A is a graphical representation 1400 of the decay rates of electrons, ions, radicals, in accordance with embodiments of the present invention. At a time T0, the one or more RF sources 117A, 117B are in a steady state and the respective levels of electrons 1402, ions 1404, and radicals 1406 are shown. The graphical representation 1400 is not shown to scale as the levels of the electrons 1402, ions 1404, and radicals 1406 in a given process recipe may or may not be in the levels relative to each other as shown. It should also be noted that the time scale shown is not linear as indicated by the breaks in the horizontal axis.

At a time T1, one or more of the RF sources 117A, 117B are modulated. For simplification of the explanation, the modulated RF sources 117A, 117B are reduced to near zero output power but it should be understood that the output power can be reduced to some value between the value at time T0 and zero output power.

The quantity of electrons 1402 present in the plasma processing volume 110 decays from the steady state level 1402A to near zero at a time T1+about 50 microseconds. The quantity of ions 1404 present in the plasma processing volume 110 decays at a much slower rate, approaching zero at a time T1+about 200 microseconds. The quantity of radicals 1406 present in the plasma processing volume 110 decays at a still slower rate, approaching zero at a time T1+about 500 microseconds or more.

As a result of the different decay rates the reactive specie varies over time. By way of example, at a time T0 steady state levels 1402A, 1404A, 1406A are shown. At a time T2, some time after T1+about 50 microseconds, substantially all of the electrons 1402 are gone and yet the quantity of ions 1404 and radicals 1406 is substantially equal to the respective steady state levels 1404A, 1406A. Similarly, at a time T3, some time after T1+about 200 microseconds, substantially all of the electrons 1402 and all of the ions 1404 have decayed to about zero, yet the quantity of radicals 1406 is still quite high and in some circumstances may be substantially equal to the radical steady state level 1406A. As the ratios of the reactive specie vary at times T0, T2 and T3, different processes can be more effectively applied at the respective times T0, T2 and T3.

Insert examples of different processes at time T0, T2 and T3.

Figure 14B:
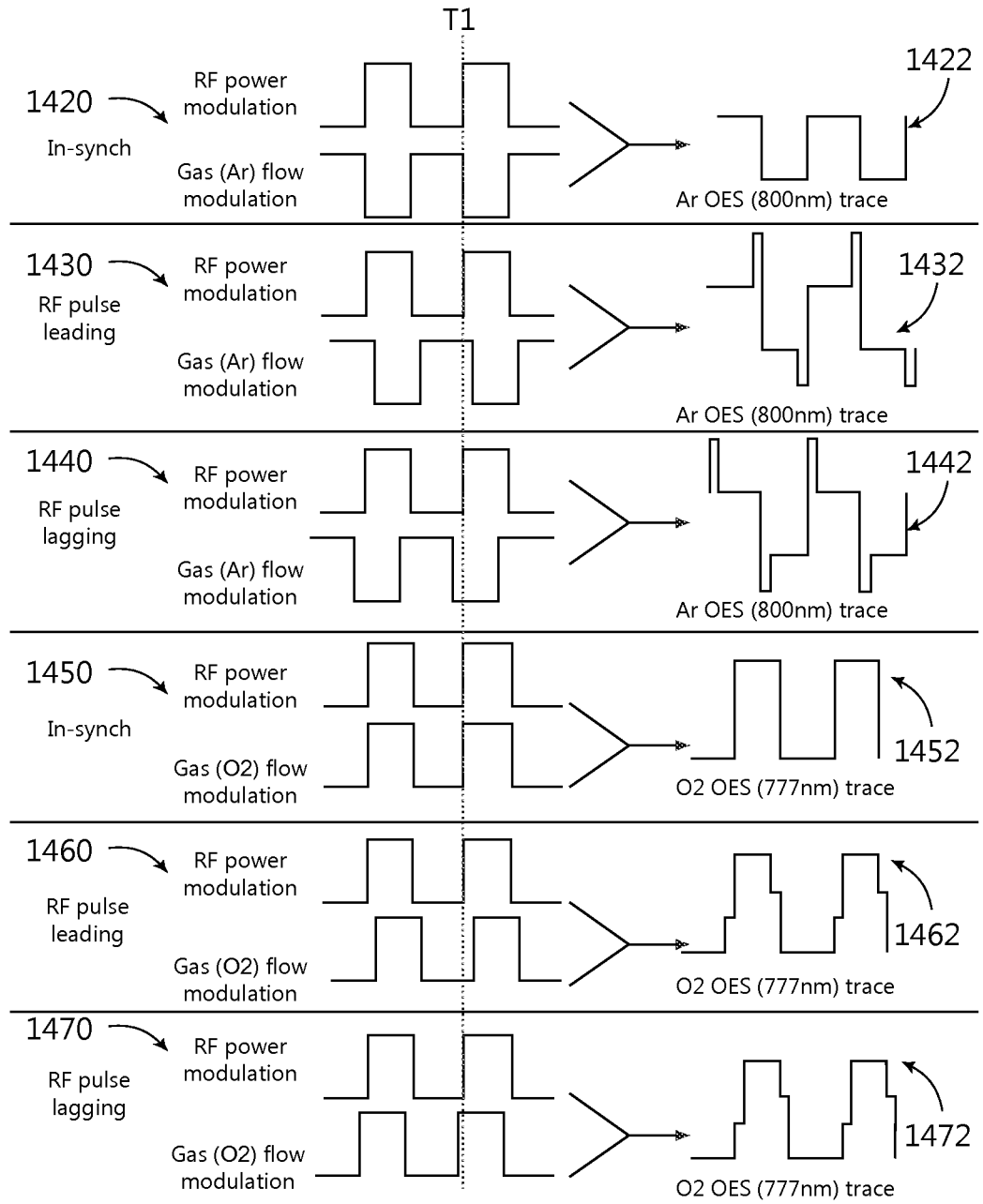
FIG. 14B is a graphical representation of multiple timing sequences of pressure pulse and RF modulation, in accordance with embodiments of the present invention.

FIG. 14B is a graphical representation of multiple timing sequences 1420-1470 of pressure pulse and RF modulation, in accordance with embodiments of the present invention. In timing graph 1420, the RF power modulation is approximately 180 degrees out of phase with process gas flow. As a result, at a time T1, the RF power is increased and the process gas flow is reduced. This timing graph 1420 can be termed 180 degrees out of phase, with the RF power modulation synchronized with the gas flow modulation. The resulting optical emission trace 1422 shows an argon (800 nm wavelength) trace proportional to both concentration and RF power. These graph illustrate a synchronized RF power and process gas modulation with a slight time offset due to instrumentation error.

In timing graph 1430, the RF power modulation is approximately 200 degrees out of phase with process gas flow. As a result, at a time T1, the RF power is increased and an about 20 degree delay after T1, the process gas flow is reduced. This timing graph 1430 can be termed 180 degrees out of phase, with the RF power modulation leading the gas flow modulation. The resulting optical emission trace 1432 shows an argon (800 nm wavelength) trace proportional to both concentration and RF power. Rising edge spikes indicate when the RF pulses are lagging the gas pulse. Falling edge spikes indicate when the RF pulses are leading the gas pulse. OES shows an actual transition time of a first process gas mixture to a second process gas mixture, while synchronizing with RF pulse and process gas pressure.

In timing graph 1440, the RF power modulation is approximately 160 degrees out of phase with process gas flow. As a result, at a time about 20 degrees before T1, the process gas flow is reduced, and at time T1, the RF power is increased. This timing graph 1440 can be termed 180 degrees out of phase, with the gas flow modulation leading the RF power modulation. The resulting optical emission trace 1442 shows an argon (800 nm wavelength) trace proportional to both concentration and RF power. Rising edge spikes indicate when the RF pulses are lagging the gas pulse. Falling edge spikes indicate when the RF pulses are leading the gas pulse 1442.

In timing graph 1450, the RF power modulation is approximately in-phase with process gas flow. As a result, at a time T1, the RF power is increased and the process gas flow is increased. This timing graph 1450 can be termed in-phase, with the RF power modulation synchronized with the gas flow modulation. The resulting optical emission trace 1452 shows an oxygen (770 nm wavelength) trace proportional to both concentration and RF power . . . .

In timing graph 1460, the RF power modulation is approximately 20 degrees out of phase with process gas flow. As a result, at a time T1, the RF power is increased and at a time of T1 plus about 20 degrees, the process gas flow is increased. This timing graph 1460 can be termed in-phase, with the RF power modulation leading the gas flow modulation. The resulting optical emission trace 1462 shows an oxygen (770 nm wavelength) trace proportional to both concentration and RF power. The steps indicate when the RF pulses are not in synch with the gas pulse . . . .

In timing graph 1470, the RF power modulation is approximately negative 20 degrees out of phase with process gas flow. As a result, at a time of about 20 degrees before T1, the process gas flow is increased and at time T1, the RF power is increased. This timing graph 1470 can be termed in-phase, with the gas flow modulation leading the RF power modulation. The resulting optical emission trace 1472 shows an oxygen (770 nm wavelength) trace proportional to both concentration and RF power. The steps indicate when the RF pulses are not in synch with the gas pulse.

Figure 15A:
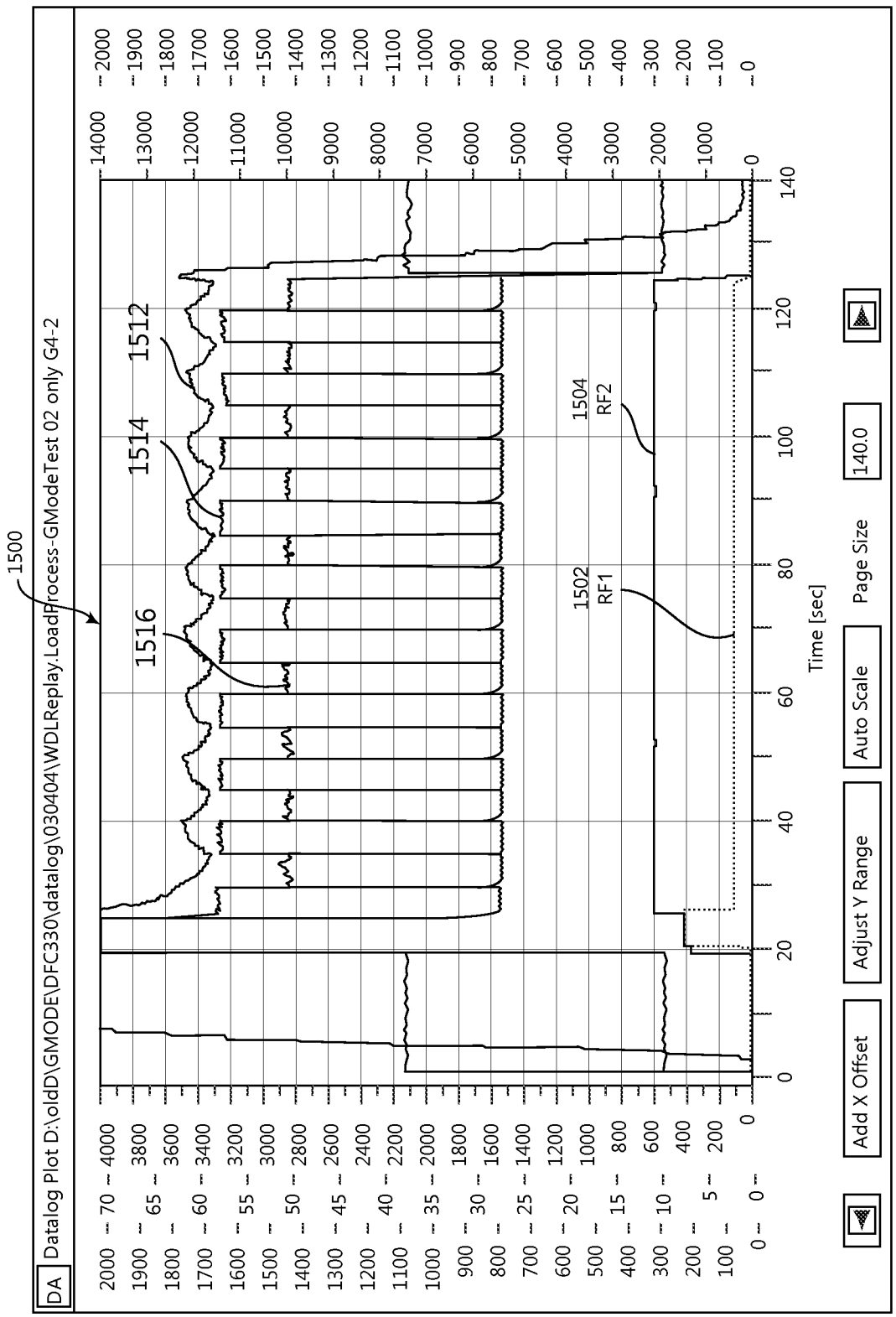
FIG. 15A is a graph of a gas only modulation, in accordance with embodiments of the present invention.

FIG. 15A is a graph 1500 of a gas only modulation, in accordance with embodiments of the present invention. The graph 1500 includes a first RF graph 1502 that can be at 27 or 60 MHz or similar high frequency. The graph 1500 also includes a second RF graph 1504 that can be at a lower frequency such as 2 MHz or similar low frequency. The pressure of the plasma processing volume 110 is shown in graph 1512. The optical emission spectrum of the argon (800 nm wavelength) injection into the plasma processing volume 110 is shown in graph 1514. The optical emission spectrum of the oxygen injection (770 nm wavelength) into the plasma processing volume 110 is shown in graph 1516. Since the RF signals 1502, 1504 are not modulated, no spikes are indicated in the OES graphs 1514, 1516.

Figure 15B:
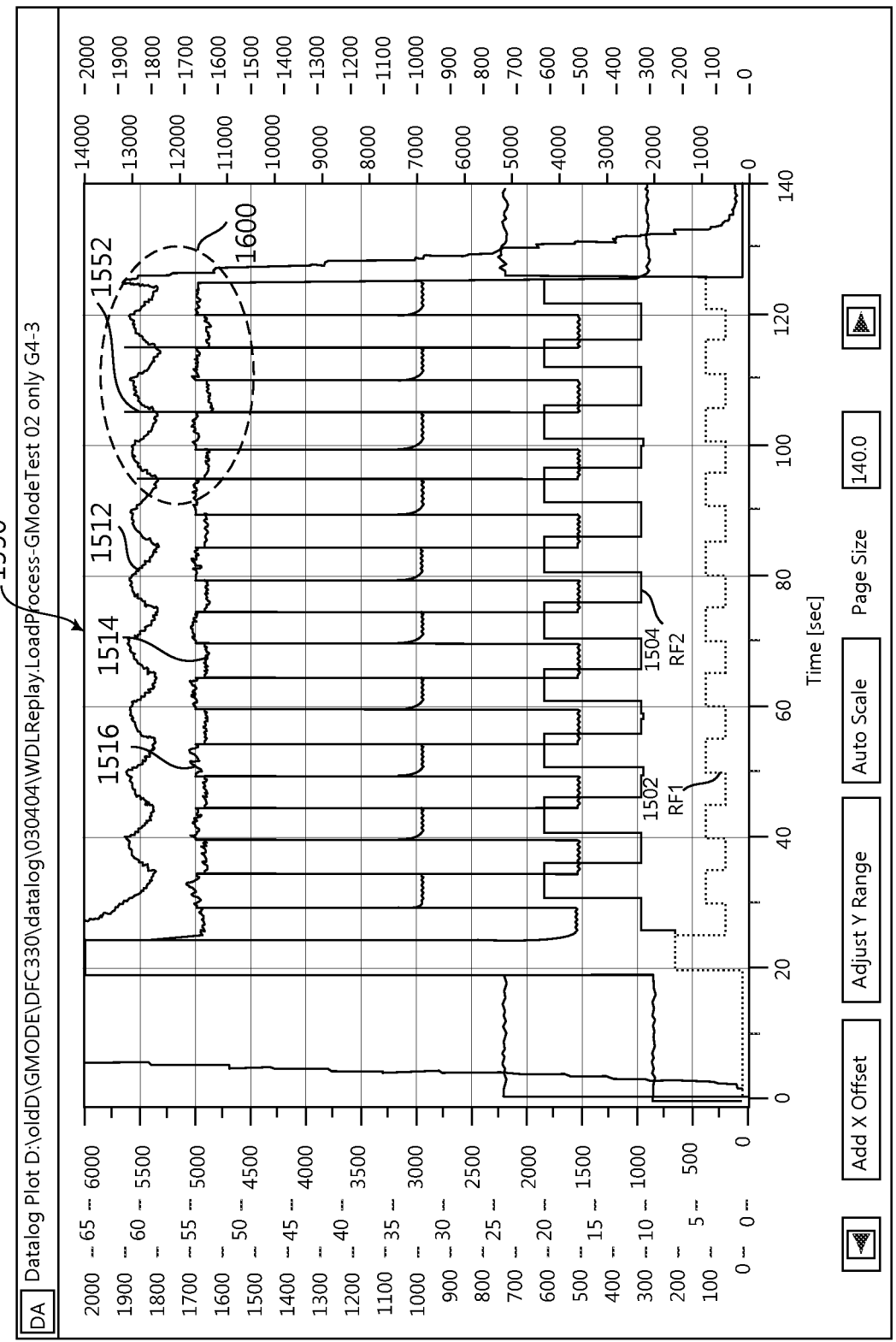
FIG. 15B is a graph of a gas and RF modulation, in accordance with embodiments of the present invention.
Figure 16:
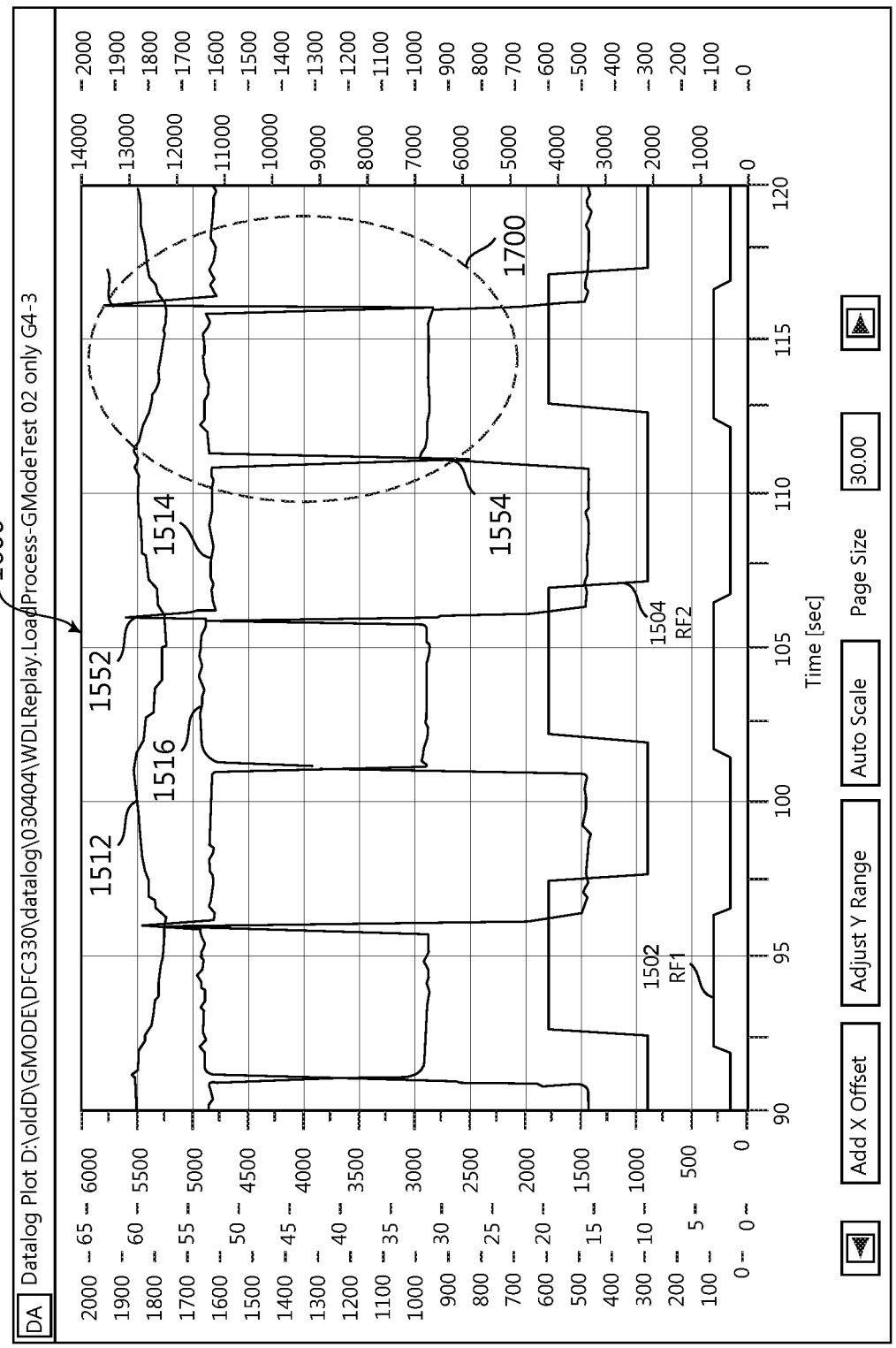
FIG. 16 is a detailed view of a portion of the graph of a gas and RF modulation, in accordance with embodiments of the present invention.
Figure 17:
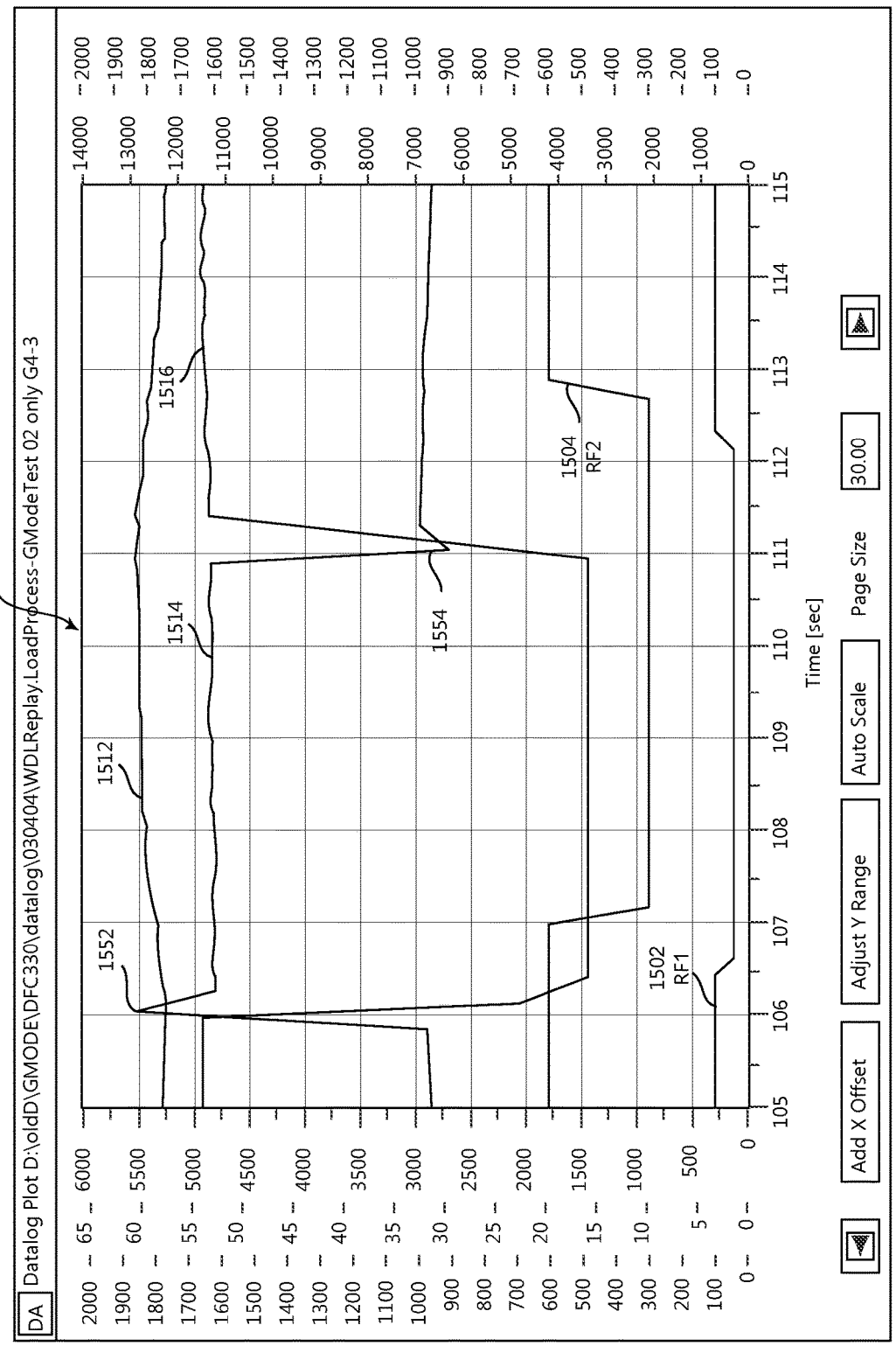
FIG. 17 is a further detailed view of a portion of the graph of a gas and RF modulation, in accordance with embodiments of the present invention.

FIG. 15B is a graph 1550 of a gas and RF modulation, in accordance with embodiments of the present invention. FIG. 16 is a detailed view of a portion 1600 of the graph 1550 of a gas and RF modulation, in accordance with embodiments of the present invention. FIG. 17 is a further detailed view of a portion 1700 of the graph 1600 of a gas and RF modulation, in accordance with embodiments of the present invention. Argon modulation graph 1514 is 180 degrees out of phase with the modulation of RF2 1504, while the oxygen modulation graph 1512 is in-phase with the modulation of RF2. Rising edge spikes 1552 indicate the RF pulses are lagging the gas pulse. Falling edge spikes 1554 indicate when the RF pulses are leading the gas pulse. Coordinating variation of the gas and RF modulation assists in the formation of high aspect ratio contacts (HARC), 3D, and NAND etch processes.

Figure 18:
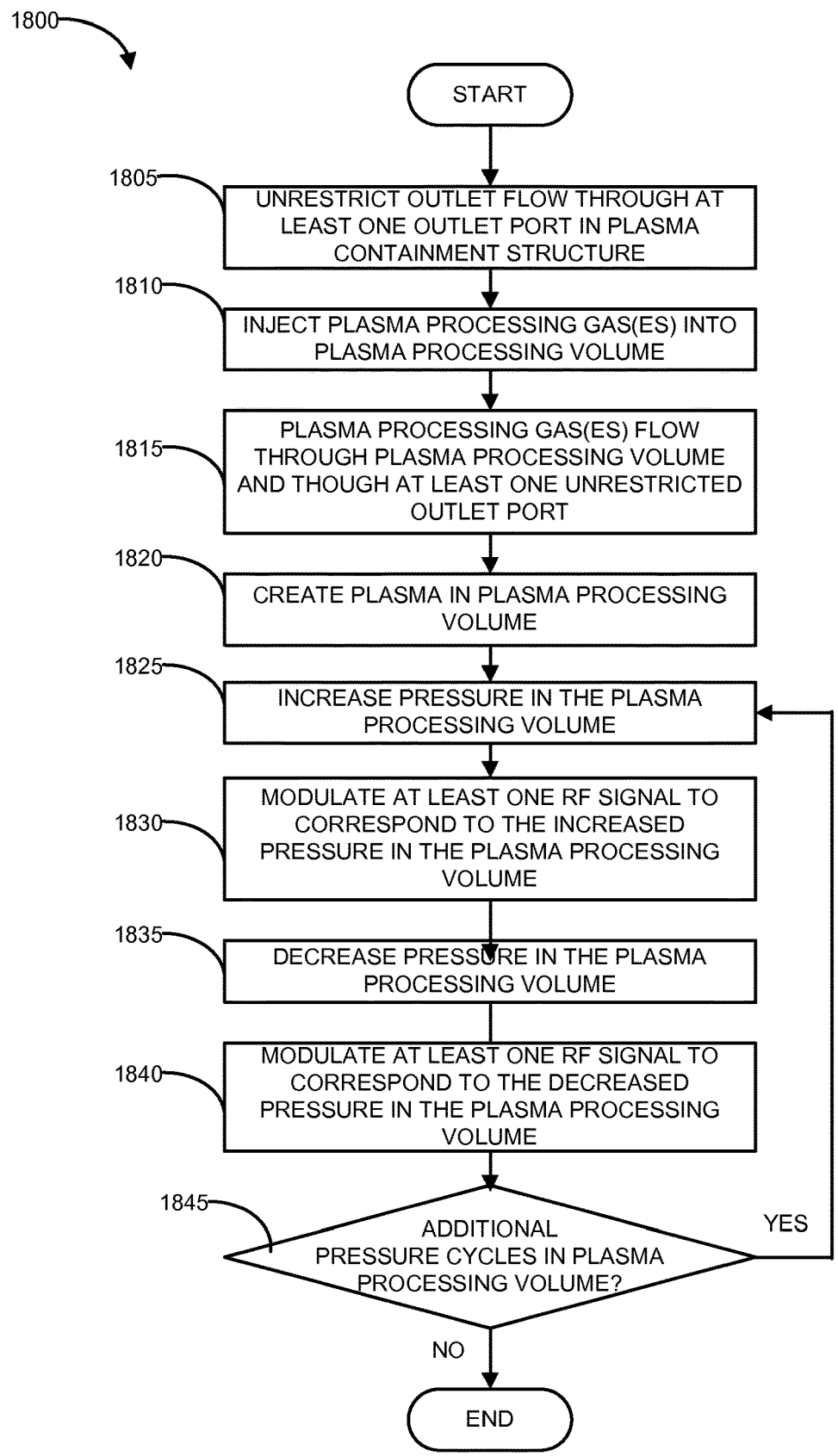
FIG. 18 is a flowchart diagram that illustrates the method operations performed in varying the pressure and modulating at least one RF source within the plasma processing volume, in accordance with embodiments of the present invention.

FIG. 18 is a flowchart diagram that illustrates the method operations 1800 performed in varying the pressure and modulating at least one RF source within the plasma processing volume 110, in accordance with embodiments of the present invention. In an operation 1805, the outlet flow through at least one outlet port 116, 116' in the plasma confinement structure 114 is substantially fully unrestricted. The outlet flow through the least one port outlet 116, 116' in the plasma confinement structure 114 can be substantially fully unrestricted by moving the corresponding conductance control structure 202, 302, 402, 202", 602 so as to align the at least one outlet port with or create corresponding openings 216, 316, 516 and/or 616.

In an operation 1810, one or more processing gases are injected into the plasma processing volume 110. In an operation 1815, the process gases 102 flow in at least one direction 112 through the plasma processing volume 110 toward one or more outlet ports 116, 116' in the plasma confinement structure 114 at the periphery of the plasma processing volume.

In an operation 1820, a plasma is formed in the plasma processing volume 110 by applying an RF signal to at least one of the top electrode 108 or the substrate support 106 (e.g. bottom electrode) from the respective RF sources 117B, 117A. The flow of the process gases 102 distribute the ions, radicals and neutrals generated by the plasma.

In an operation 1825, the pressure is increased in the plasma processing volume 110. The pressure in the plasma processing volume 110 can be increased by substantially fully restricting the outlet flow through least a portion of the at least one outlet port 116, 116' as described in more detail above.

As the pressure reaches a desired set point, one or both of the RF sources 117A, 117B can be modulated, reduced, enabled or disabled operational state to also allow further selection of the ratios of ions, radicals and neutral species in the plasma in an operation 1830.

In an operation 1835, the pressure is decreased in the plasma processing volume 110. The pressure in the plasma processing volume 110 can be decreased by reducing the restriction of the outlet flow through at least a portion of the outlet ports 116, 116' as described in more detail above.

As the pressure reaches a desired set point, one or both of the RF sources 117A, 117B can be modulated, reduced, enabled or disabled operational state to further select or control the ratios of ions, radicals and neutral species in the plasma in an operation 1840.

In an operation 1845, the method operations can end if no additional pressure and/or RF modulation cycles are required in the plasma processing volume 110. Alternatively, if additional pressure cycles and/or RF modulation are required in the plasma processing volume 110 then the method operations can continue in an operation 1825 above.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources. The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium or logic circuits. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing system comprising:
   a processing chamber;
   at least one gas source coupled to the processing chamber, the processing chamber including:
      a top electrode disposed within a top portion of the processing chamber;
      a substrate support disposed opposite from the top electrode;
      a plasma processing volume having a volume less than a volume of the processing chamber, the plasma processing volume being defined by:
         a surface of the top electrode;
         a supporting surface of the substrate support opposing the surface of the top electrode; and
         an outer perimeter defined by a plasma confinement structure, the plasma confinement structure including a plurality of outlet ports;
   at least one RF source coupled to at least one of the substrate support or the top electrode; and
   a conductance control ring movably disposed below the plurality of outlet ports of the plasma confinement structure, and
   a controller for controlling operations of the plasma processing system, the controller is coupled to the at least one gas source, the conductance control ring, and the at least one RF source, the controller configured to,
      inject at least one process gas into the plasma processing volume of the processing chamber and provide RF power to the plasma processing volume to form a plasma,
      cause pulsing of pressure of the plasma processing volume by movement of the conductance control ring between a first position and a second position and modulate an input flow rate of the at least one process gas during a selected processing state, the conductance control ring restricts an outlet flow through the plurality of outlet ports when disposed in the first position to a first flow rate and increases the outlet flow through the plurality of outlet ports when disposed in the second position to a second flow rate, and
      modulate the RF power provided by the at least one RF source to be synchronized with modulation of the input flow rate of the at least one process gas so as to set a pulsed state of the RF power that is synchronized to a pulsed state of the pressure during the selected processing state.

2. The system of claim 1, wherein the modulation of the at least one RF source is synchronized to be substantially in-phase with the input flow rate of the at least one process gas when in the selected processing state.

3. The system of claim 1, wherein the modulation of the at least one RF source is synchronized to be substantially 180 degrees out of phase with the input flow rate of the at least one process gas when in the selected processing state.

4. The system of claim 1, wherein the modulation of the at least one RF source is set to lag the input flow rate of the at least one process gas when in the selected processing state.

5. The system of claim 1, wherein the modulation of the at least one RF source is set to lead the input flow rate of the at least one process gas when in the selected processing state.

6. The system of claim 1, wherein the at least one RF source includes a high frequency RF source having an output of about 27 MHz.

7. The system of claim 1, wherein the at least one RF source includes a high frequency RF source having an output of about 60 MHz.

8. The system of claim 1, wherein the at least one RF source includes a high frequency RF source having an output of greater than about 27 MHz and a low frequency RF source having an output of about 2 MHz.

9. The system of claim 1, wherein the plurality of outlet ports in the plasma confinement structure is formed in a substantially horizontal portion of the plasma confinement structure.

10. A chamber system, comprising,
    a substrate support;
    a top electrode;
    at least one RF source coupled to at least one of the substrate support or the top electrode;
    a confinement structure disposed to surround the substrate support, such that a plasma processing volume is defined between the substrate support, the top electrode and the confinement structure, the confinement structure includes a plurality of outlet ports that surround the substrate support;
    a conductance control ring disposed below and proximate to the plurality of outlet ports of the confinement structure and outside of the plasma processing volume, the conductance control ring having a positioning actuator that provides movement of the conductance control ring between a first position and a second position, the first position placing the conductance control ring immediately adjacent to the plurality of outlet ports and the second position placing the conductance control ring in a location spaced away from the plurality of outlet ports and wherein the at least one RF source is modulated; and
    a controller, the controller is configured to,
       inject at least one process gas into the plasma processing volume and provide RF power from the at least one RF source to the plasma processing volume to form a plasma,
       cause pulsing of pressure of the plasma processing volume by movement of the conductance control ring between a first position and a second position and modulate an input flow rate of the at least one process gas during a selected processing state, the conductance control ring restricts an outlet flow through the plurality of outlet ports when disposed in the first position to a first flow rate and increases the outlet flow through the plurality of outlet ports when disposed in the second position to a second flow rate, and
       modulate the RF power provided by the at least one RF source to be synchronized with modulation of the input flow rate of the at least one process gas so as to set a pulsed state of the RF power that is synchronized to a pulsed state of the pressure during the selected processing state.

11. The chamber system of claim 10, wherein the modulation of the at least one RF source is synchronized to be substantially in-phase with the input flow rate when in the selected processing state.

12. The system of claim 10, wherein the modulation of the at least one RF source is synchronized to be substantially 180 degrees out of phase with the input flow rate when in the selected processing state.

13. The system of claim 10, wherein the modulation of the at least one RF source is set to lag the input flow rate when in the selected processing state.

14. The system of claim 10, wherein the modulation of the at least one RF source is set to lead the input flow rate when in the selected processing state.

* * * * *